United States Patent
Becker et al.

(10) Patent No.: US 8,093,798 B2
(45) Date of Patent: Jan. 10, 2012

(54) LUMINESCENT SUBSTANCE OF THE CLASS OF NITRIDE SILICATES AND LIGHT SOURCE HAVING SUCH A LUMINESCENT SUBSTANCE

(75) Inventors: Daniel Becker, Augsburg (DE); Tim Fiedler, München (DE); Frank Jermann, Königsbrunn (DE); Christian Koch, Oberottmarshausen (DE); Bianca Pohl, München (DE)

(73) Assignee: OSRAM AG, München (DE)

( * ) Notice: Subject to any disclaimer, the term of this patent is extended or adjusted under 35 U.S.C. 154(b) by 79 days.

(21) Appl. No.: 12/375,671

(22) PCT Filed: Jul. 31, 2007

(86) PCT No.: PCT/EP2007/057870
§ 371 (c)(1),
(2), (4) Date: May 21, 2009

(87) PCT Pub. No.: WO2008/015207
PCT Pub. Date: Feb. 7, 2008

(65) Prior Publication Data
US 2009/0322209 A1    Dec. 31, 2009

(30) Foreign Application Priority Data
Aug. 4, 2006    (DE) .................. 10 2006 036 577

(51) Int. Cl.
*H01J 1/62* (2006.01)
*H01J 63/04* (2006.01)
*C09K 11/02* (2006.01)

(52) U.S. Cl. .................. 313/503; 252/301.4 R
(58) Field of Classification Search ........... 252/301.4 R, 252/301.4 F; 313/486, 503; 423/328.1
See application file for complete search history.

(56) References Cited

U.S. PATENT DOCUMENTS

| 4,810,938 | A | 3/1989 | Johnson et al. |
| 6,958,575 | B2 | 10/2005 | Dombrowski et al. |
| 2003/0030368 | A1 | 2/2003 | Ellens et al. |
| 2007/0259206 | A1* | 11/2007 | Oshio ................... 428/690 |
| 2008/0157653 | A1* | 7/2008 | Schmidt et al. ........... 313/503 |

FOREIGN PATENT DOCUMENTS

EP    1 153 101    11/2000
(Continued)

OTHER PUBLICATIONS

R. Le Toquin et al., "Red-emitting cerium-based phosphor materials for solid-state lighting applications", Chemical Physics Letters, vol. 423, pp. 352-356, Jun. 1, 2006.

*Primary Examiner* — Karabi Guharay
*Assistant Examiner* — Michael Santonocito
(74) *Attorney, Agent, or Firm* — Cozen O'Connor

(57) ABSTRACT

A phosphor from the class of nitridosilicates from the M-Al—Si—N system, comprising a cation M, wherein M is represented by Ca alone or is represented by a mixture of Ca with at least one further element from the group Ba, Sr, Mg, Zn, Cd, Li, Na, Cu, wherein the phosphor is activated with at least one element from the group Eu, Ce which partly replaces M, characterized in that the phosphor forms a phase that is to be assigned to the system M3N2-AlN-Si3N4, wherein the atomic ratio of the constituents M:Al$\geq$0.375 and the atomic ratio Si/Al$\geq$1.4.

21 Claims, 25 Drawing Sheets

FOREIGN PATENT DOCUMENTS

| | | |
|---|---|---|
| EP | 1 278 250 | 5/2002 |
| EP | 1 568 753 | 2/2005 |
| EP | 1 630 220 | 3/2006 |
| EP | 1630220 A2 * | 3/2006 |
| KR | 10-2004-0046550 A * | 12/2005 |
| WO | WO 01/40403 | 6/2001 |
| WO | WO 02/103748 | 12/2002 |

* cited by examiner

LUMINESCENT SUBSTANCE OF THE CLASS OF NITRIDE SILICATES AND LIGHT SOURCE HAVING SUCH A LUMINESCENT SUBSTANCE

RELATED APPLICATIONS

This is a U.S. national stage of application No. PCT/EP2007/057870, filed on Jul. 31, 2007.

This application claims the priority of German patent application no. 10 2006 036 577.1 filed Aug. 4, 2006, the content of which is hereby incorporated by reference.

FIELD OF THE INVENTION

The invention relates to a phosphor from the class of nitridosilicates in accordance with the preamble of claim 1. The invention relates, in particular, to a red or green emitting phosphor, preferably for use in light sources. The invention furthermore relates to a light source produced therewith and a method for producing such a phosphor.

PRIOR ART

EP-A 1 568 753 discloses a phosphor which emits red and has the composition MSiAlN3:Z. In this case, M is principally Ca and the activator is Eu. This phosphor can readily be excited in the UV and blue spectral range. It is suitable for light sources such as LEDs. EP-A 1 153 101 discloses a red emitting phosphor M2Si5N8:Eu, wherein M can be Ca, inter alia, and the activator is Eu. In addition, EP-A 1 278 250 discloses an Eu-activated alpha-sialon which has a very good thermal behavior, the emission color locus of which lies in the yellow spectral range.

SUMMARY OF THE INVENTION

It is an object of the present invention to provide a phosphor having a high efficiency, and specify a light source comprising such a phosphor. It is a further object to provide a phosphor which emits red or green, and which can be excited in particular in the emission range of typical UV or blue emitting LEDs.

A further object is to provide a light source, in particular an LED, comprising such a phosphor.

The phosphors according to the invention can also be used in connection with other UV or blue light sources such as molecular emitters (e.g. In discharge lamp), blue OLEDs, or in combination with blue EL phosphors.

The phosphor according to an embodiment of the invention is a novel compound from the M-Al—Si—N system, in particular from the Ca—Al—Si—N system, and makes it possible to produce color-stable, efficient LEDs or LED modules on the basis of a conversion LED. Further areas of application include LEDs having good color rendering, color on demand LEDs or white OLEDs. The novel phosphor can furthermore be employed in conventional lamps, in particular fluorescent lamps, but also for electrical devices such as CRT, PDP, FED, etc.

Specifically, what is involved is, in particular, a red emitting phosphor from the M-Al—Si—N system, comprising a cation M, wherein M can be Ca alone or Ca combined with at least one further element from the group Ba, Sr, Mg, Zn, Cd, wherein the phosphor is activated with Eu alone or in combination with Ce. The activator partly replaces the M and the phosphor forms a phase that is to be assigned to the system M3N2-AlN—Si3N4. Alternatively, what is involved is a green emitting phosphor from the same system and doped with Ce. In all cases, the atomic ratio of the constituents M:Al and M:Si is defined by the empirical formula $Ca_{5-\delta}Al_{4-2\delta}Si_{8+2\delta}N_{18}$:Eu where $|\delta| \leq 0.5$. That is to say that the novel silicon-rich phase always contains at least 40% more silicon than aluminum. To put it another way, the ratio Si/Al is at least 1.4.

The novel phosphor emits in broadband fashion and is very stable. It is suitable primarily as a red phosphor for use in color on demand LEDs, white LEDs, in particular having color temperatures of <5000 K, and in other lamps. The phosphor has a relatively high visual useful effect (Vs=0.33) with regard to its emission maximum in the red at approximately 640 nm (1% Eu) and a significantly improved thermal quenching behavior by comparison with the phosphor Ca2Si5N8:Eu, previously known from EP-A 1 153 101, and the phosphor CaAlSiN3:Eu from EP-A 1 568 753.

Known red phosphors which can also be excited efficiently in the near UV or in the blue are, alongside the not very chemically stable sulfides such as (Sr, Ca)S:Eu and the potentially environmentally harmful compounds such as Sr(S,Se):Eu, the so-called nitridosilicates that crystallize predominantly in the monoclinic Ca2Si5N8 phase or in the orthorhombic Sr2Si5N8 phase and also CaAlSiN3:Eu. Given corresponding Eu doping (1%), the phosphors with an orthorhombic CaAlSiN3:Eu phase, as described in EP 1 568 753, have a deep red emission with a low visual useful effect (<0.3). By contrast, at usable Eu concentrations, Ca2Si5N8-based phosphors emit in relatively short-wave fashion (at approximately 615 nm), but exhibit pronounced thermal quenching.

BRIEF DESCRIPTION OF THE DRAWINGS

The invention will be explained in more detail below on the basis of a plurality of exemplary embodiments. In the figures.

PREFERRED EMBODIMENT OF THE INVENTION

A novel Eu-doped phosphor has, in particular, approximately the stoichiometry Ca5Al4Si8N18:Eu. Ca here is representative of M. This stoichiometry results from the composition of the starting materials and can therefore vary within certain limits in the compound since the phase described here has a considerable phase width. Analyses confirm the composition within the scope of the standard deviations. The existence range of the new phase can be clearly delimited with respect to CaAlSiN3:Eu. The basic lattice of Ca5Al4Si8N18 surprisingly shows in the XRD (X-ray diffraction diagram) a reflection pattern similar to the entry in accordance with JCPDS 39-747. By contrast, it shows significantly different reflection patterns than the phosphor CaAlSiN3:Eu described in EP-A 1 568 753. This difference is also clearly verifiable from the luminescence properties.

This phosphor affords a good compromise between sufficiently red emission and visual useful effect. In this case, it absorbs the emission of green and/or yellow phosphors, which, under certain circumstances, are disposed upstream of a light source together with this red phosphor, to a lesser extent than is the case with the compounds $(Sr, Ca)_2Si5N8:Eu$ and in particular CaAlSiN3:Eu. The better thermal quenching behavior is highly advantageous, moreover, by comparison with all other known red phosphors. The phosphor thus makes it possible, inter alia, to produce efficient warm-white LEDs on the basis of the conversion of a plurality of phosphors with color temperatures of between 2700 and 4200 K.

Figure 1:
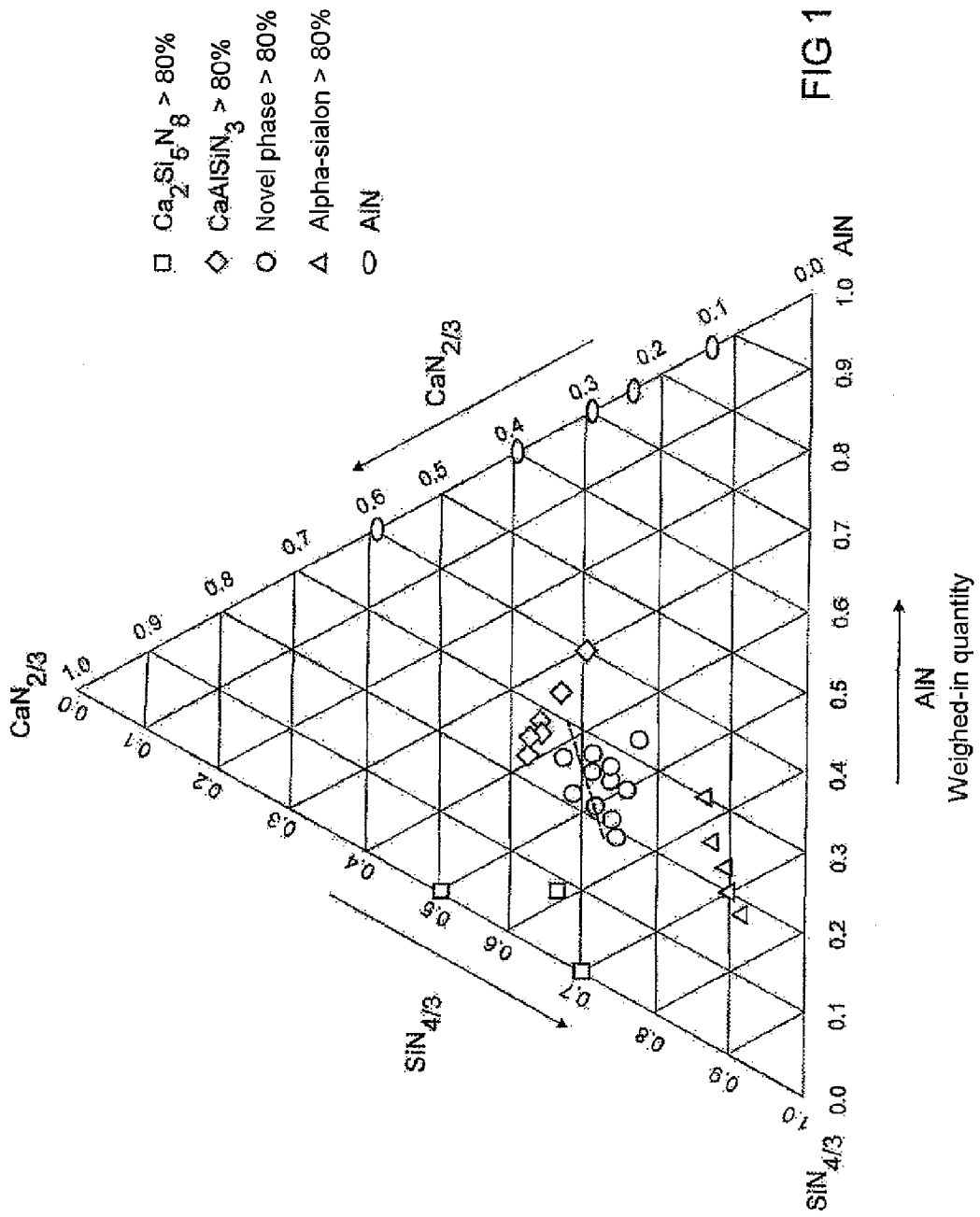
FIG. 1 shows a phase triangle showing the existence range of different compounds.
Figure 20:
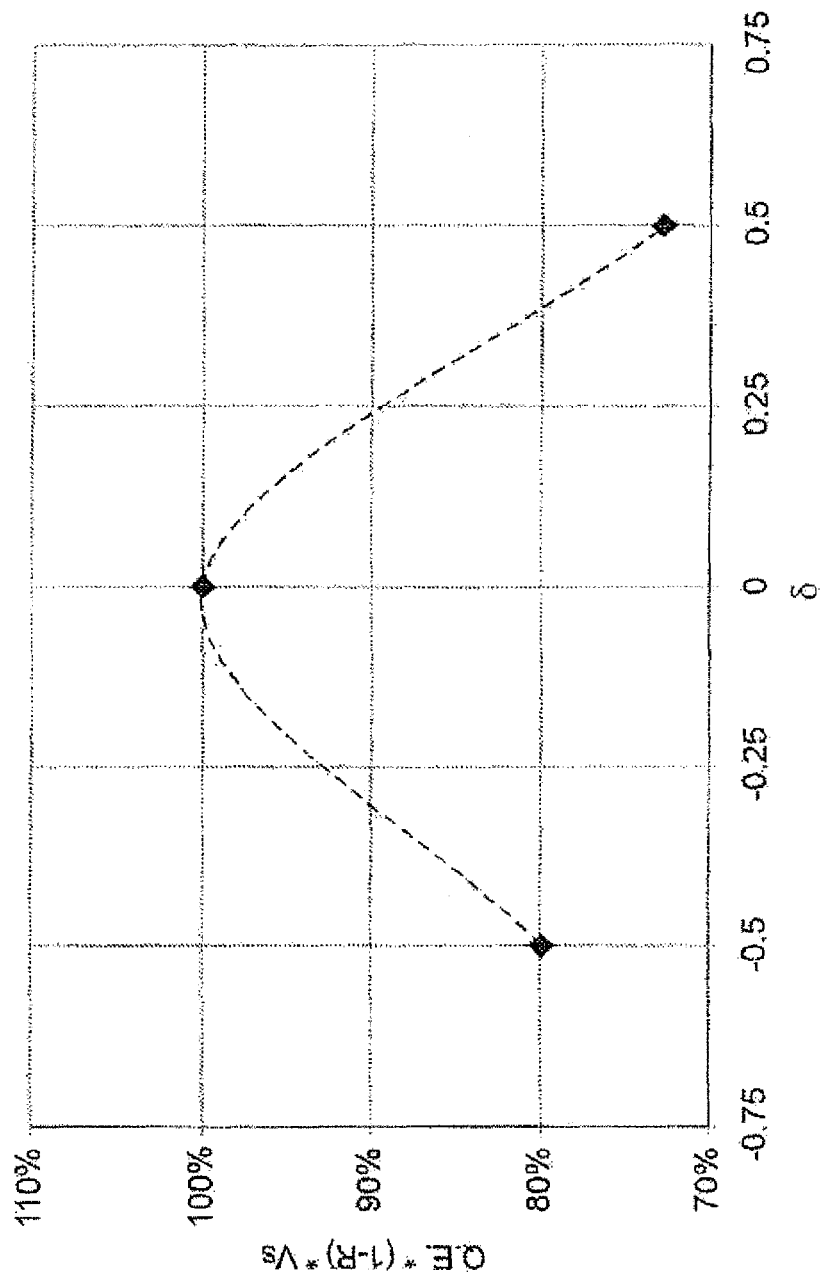
FIG. 20 shows the brightness of a novel red emitting phosphor as a function of the parameter δ.

FIG. 1 shows a phase triangle spanned by the binary "compounds" $SiN_{4/3}$, AlN and $CaN_{2/3}$. The existence range of different compounds is shown here, a phase proportion of at least 80% being assumed in each case as a prerequisite. In the case of a CaN2/3 proportion of less than 0.2, virtually oxygen-free alpha-sialon $Ca_x(Si,Al)_{12}(O,N)_{16}$:Eu predominantly arises. In the case of AlN<0.15, Ca2Si5N8:Eu predominantly forms. In the case of a Ca/Si ratio of approximately 1:1 and an Al content of more than 0.2, the known CaAlSiN3:Eu phase predominantly forms. The novel silicon-richer phase is predominantly formed in a region lying between these known phases. This phase has a particularly high efficiency as a phosphor if the relative ratios Al=0.7 to 0.9 and Si=1.5 to 1.8 hold true for the ratios Ca:Al:Si, in relation to Ca=1. A simple stoichiometric representation for a compound which exhibits a very high efficiency is represented by the empirical formula $Ca_{5-\delta}Al_{4-2\delta}Si_{8+2\delta}N_{18}$:Eu where $-0.5 \leq \delta \leq 0.5$. This composition range is depicted as a dashed line in the phase triangle in FIG. 1. Samples having >80% of the novel phase below this line tend to have primarily AlN as a foreign phase. The virtually white aluminum nitride impairs the absorption of the phosphor in the spectral range of the exciting radiation and is therefore undesirable. Samples slightly above the line essentially contain too much calcium nitride in the starting materials. However, the unreacted calcium nitride evaporates at the high synthesis temperatures thus resulting generally in substantially phase-pure samples. As can be gathered from FIG. 20, the product of quantum efficiency, absorption of the exciting radiation and visual useful effect, that is to say the eye-assessed brightness of the phosphor, assumes a maximum for compounds on the line where $|\delta| \approx 0$. Therefore, the compound having the empirical formula Ca5Al4Si8N18:Eu is a particularly preferred embodiment of the phosphor according to the invention.

Figure 2:
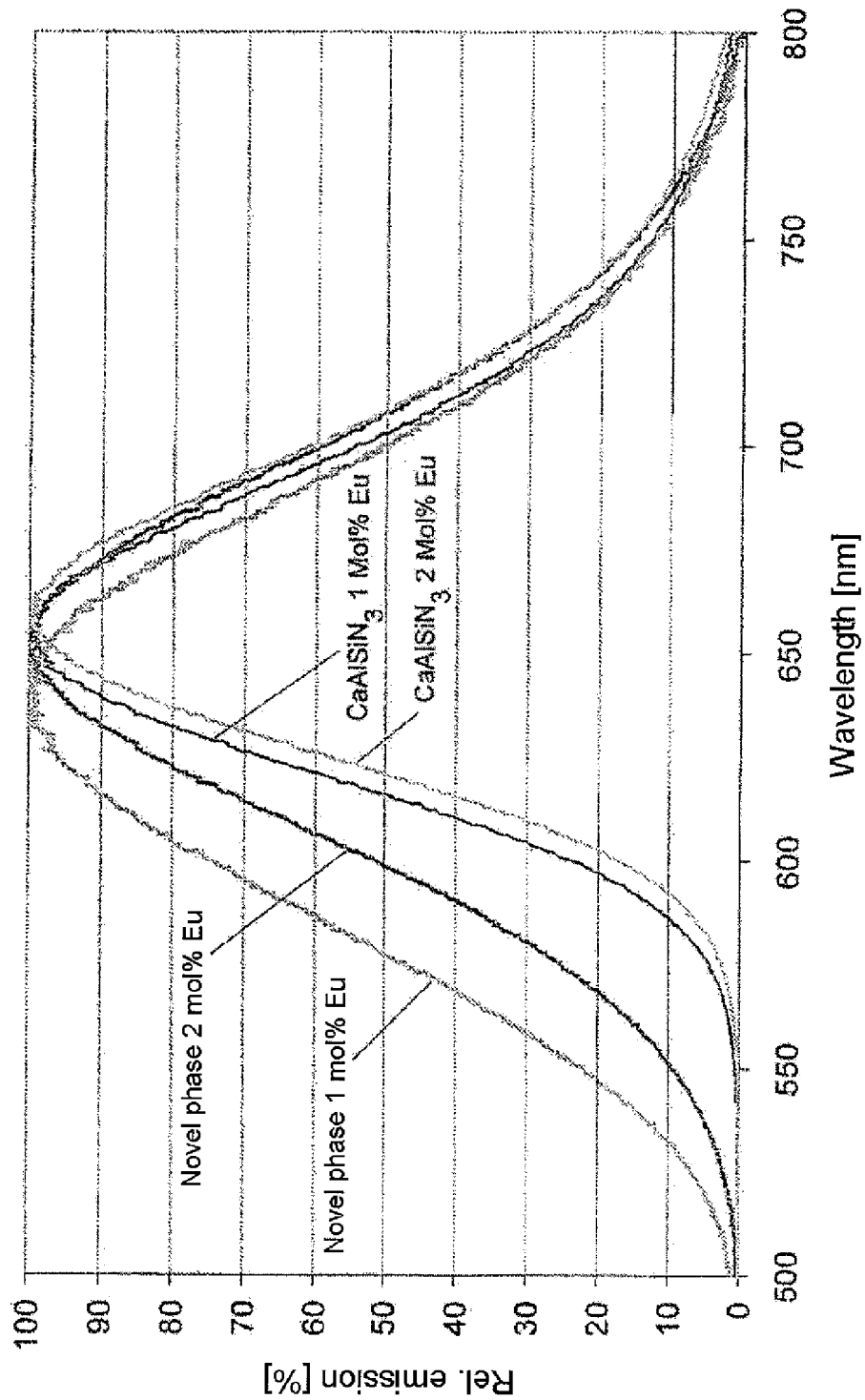
FIG. 2 shows a comparison of the emissions of different phosphors for different concentrations of the activator.

FIG. 2 shows a comparison of the emissions of the novel silicon-richer phase with the previously known CaAlSiN3:Eu phase at two different Eu concentrations, namely 1 and 2 mol %. In this case, the Eu always replaces the Ca. The novel silicon-richer phase is somewhat broader in bandwidth and significantly shifted toward the short-wave spectrum.

Figure 3:
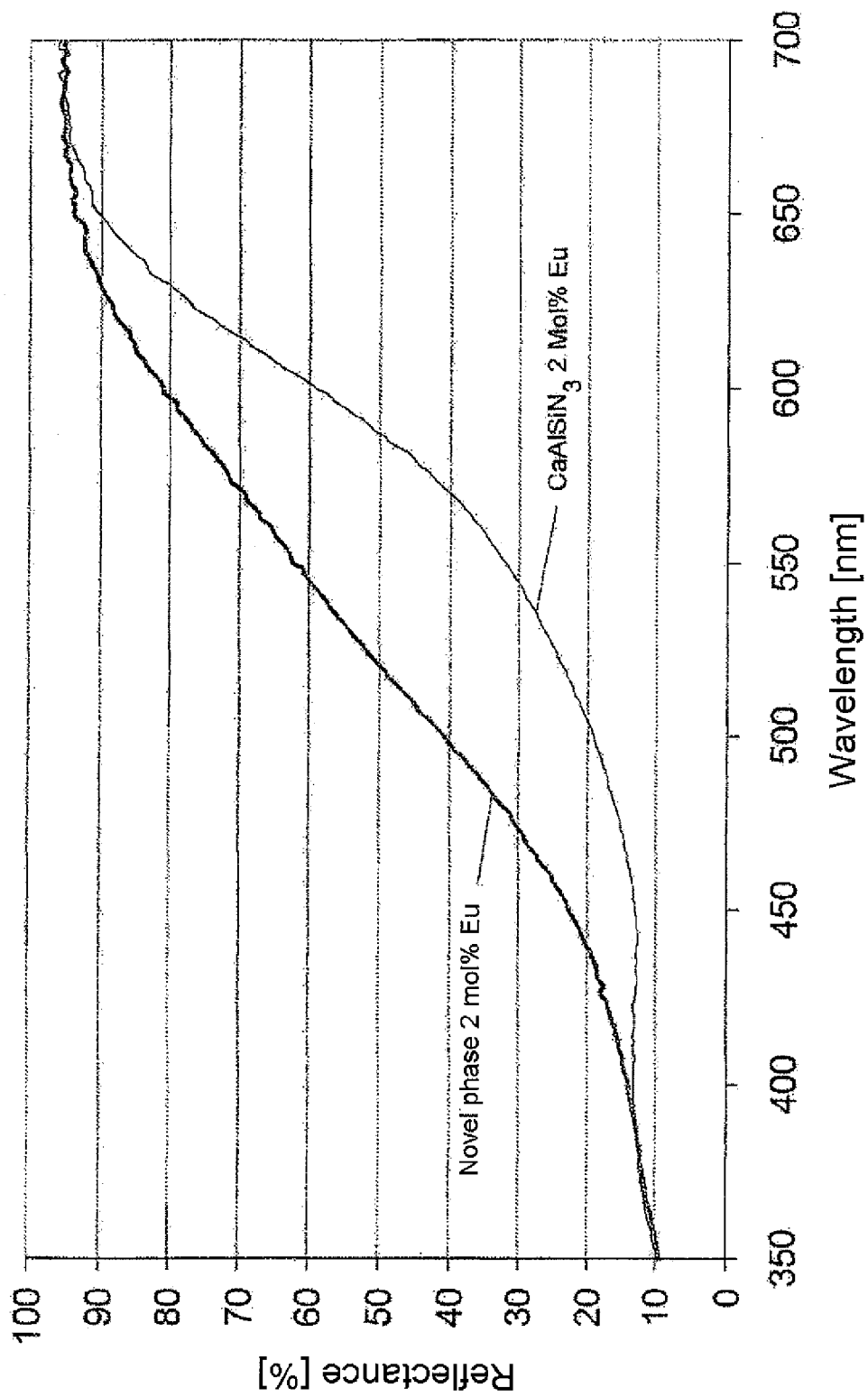
FIG. 3 shows a comparison of the reflectance of different phosphors for the same concentration of the activator.

FIG. 3 shows a comparison of the reflectance of the novel silicon-richer phase with the known CaAlSiN3:Eu phase for the same Eu concentration, namely 2 mol %. In this case, the Eu always replaces the Ca. Given UV excitation in combination with a green and yellow phosphor known per se, the novel silicon-richer phase is advantageous by comparison with the known CaAlSiN3:Eu phase since, with comparable absorption in the UV around 380-400 nm, it does not absorb as greatly in the blue to yellow-green spectral range.

Figure 4:
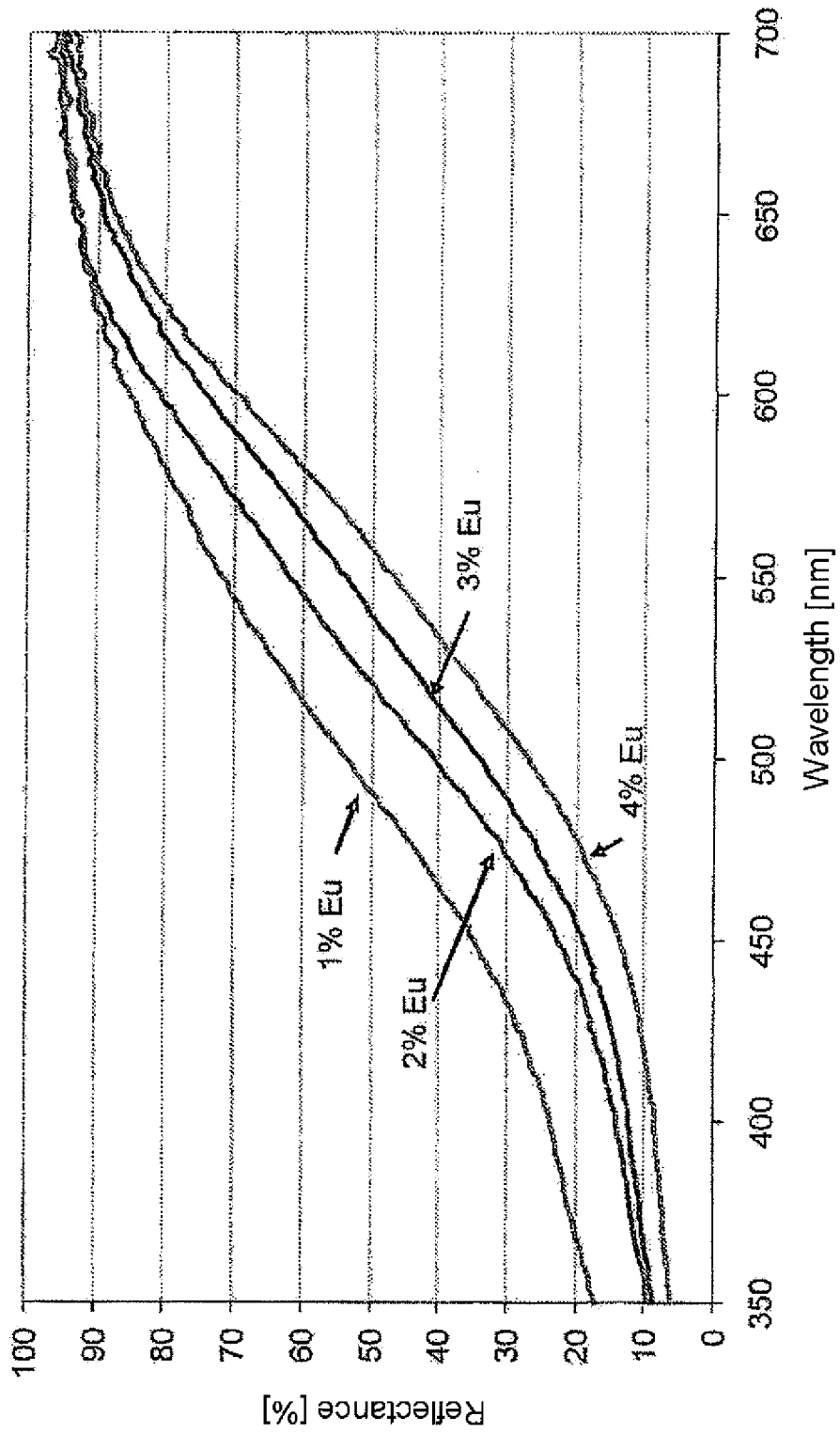
FIG. 4 shows a comparison of the reflectance of the novel phosphor for different concentrations of the activator.

FIG. 4 shows the comparison of the reflectance of the novel silicon-rich phase for different Eu concentrations. The higher the Eu concentration, the lower the reflectance becomes.

Figure 5:
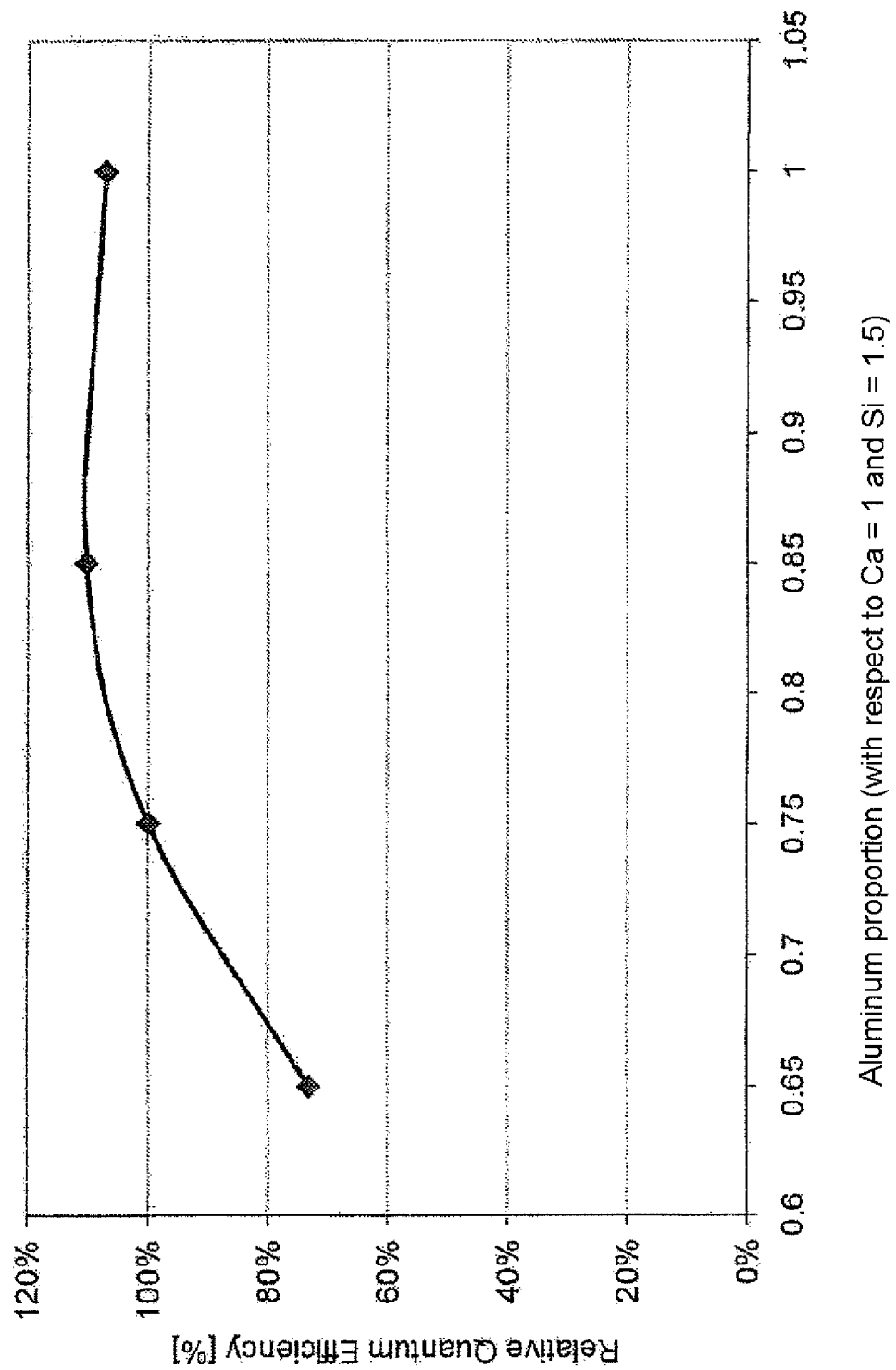
FIG. 5 shows the relative efficiency as a function of the aluminum proportion.

FIG. 5 shows the efficiency of the novel phosphor as a function of the proportion of aluminum given a fixedly chosen Ca and Si proportion. In this case, Ca=1 and Si=1.5. The maximum is at approximately Al=0.8-0.9 in accordance with the preferred stoichiometry.

Figure 6:
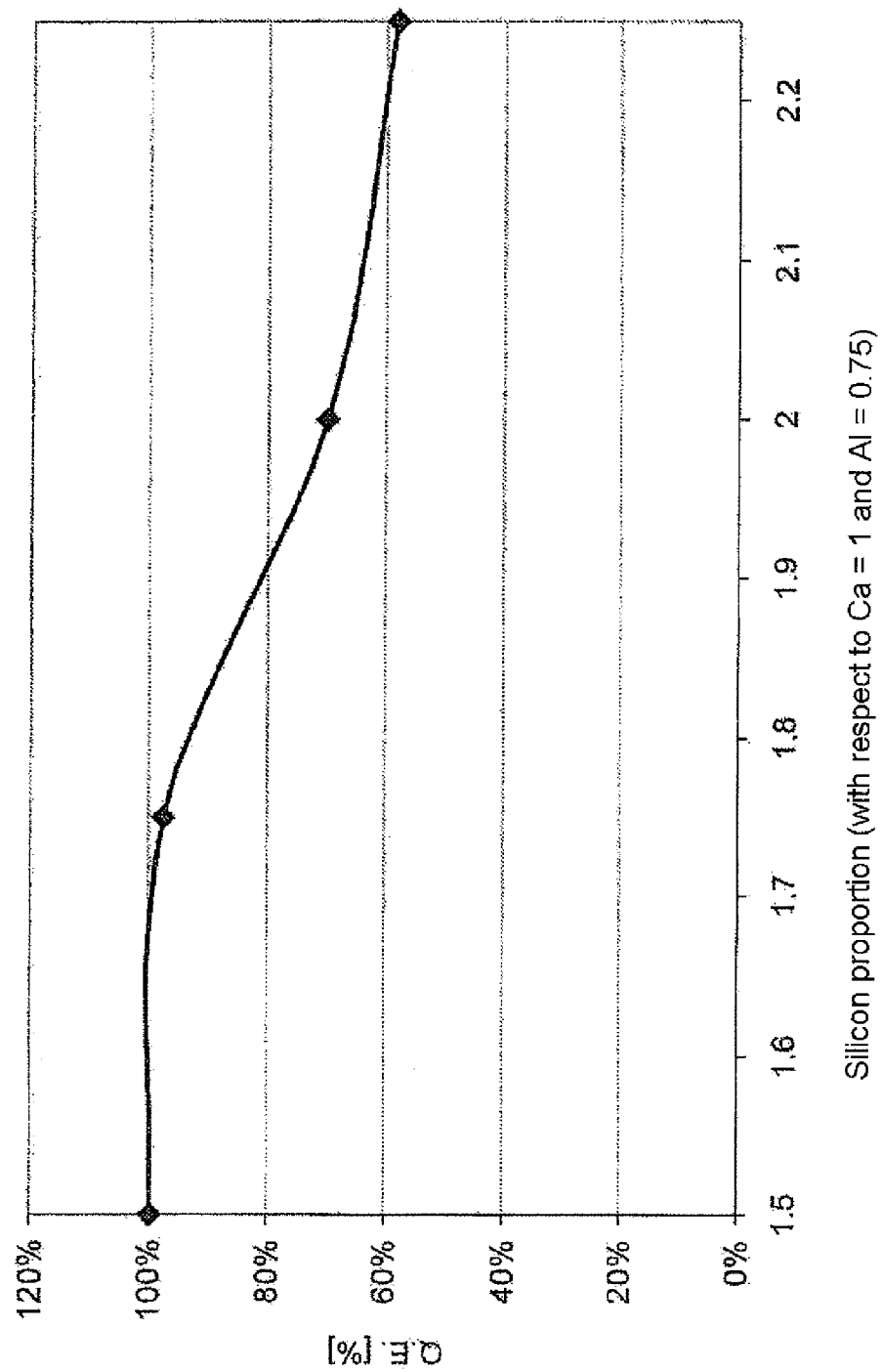
FIG. 6 shows the relative efficiency as a function of the silicon proportion.

In a similar manner, FIG. 6 shows the efficiency of the novel phosphor as a function of the proportion of silicon given a fixedly chosen Ca and Al proportion. In this case, Ca=1 and Al=0.75. The maximum is at approximately Si=1.5 to 1.8 in accordance with the preferred stoichiometry.

Figure 7:
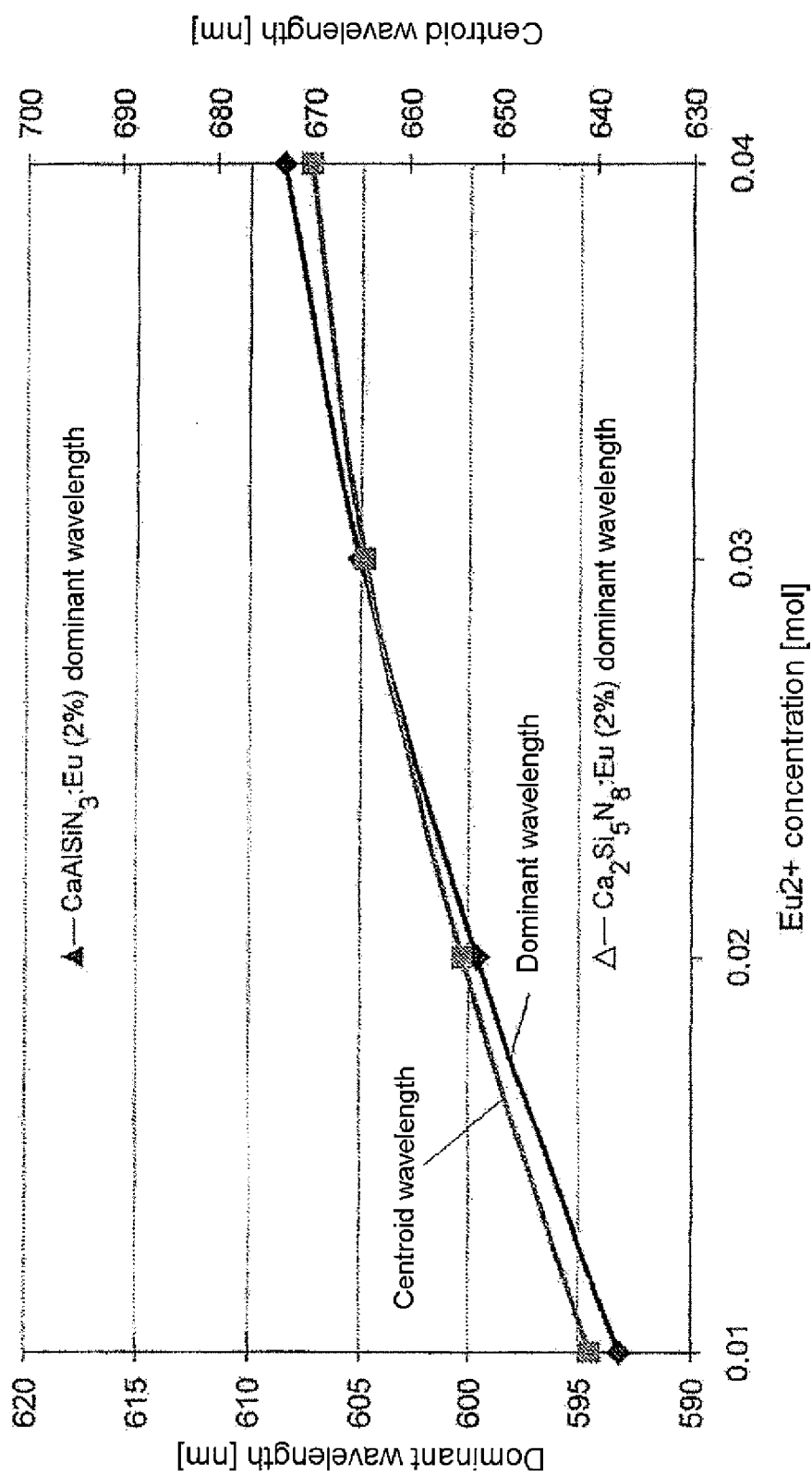
FIG. 7 shows the dependence of dominant and centroid wavelengths of the novel phosphor on the activator concentration.

FIG. 7 shows the dependence of the dominant and centroid wavelengths (rhombi and squares, respectively) on the concentration of the activator Eu2+ in the range of 1 mol % to 4 mol %. Given the same Eu content, the emission is significantly longer in wavelength than in the case of Ca2Si5N8:Eu and significantly shorter in wavelength than in the case of CaAlSiN3:Eu, which are likewise plotted for an Eu proportion of 2%.

Figure 8:
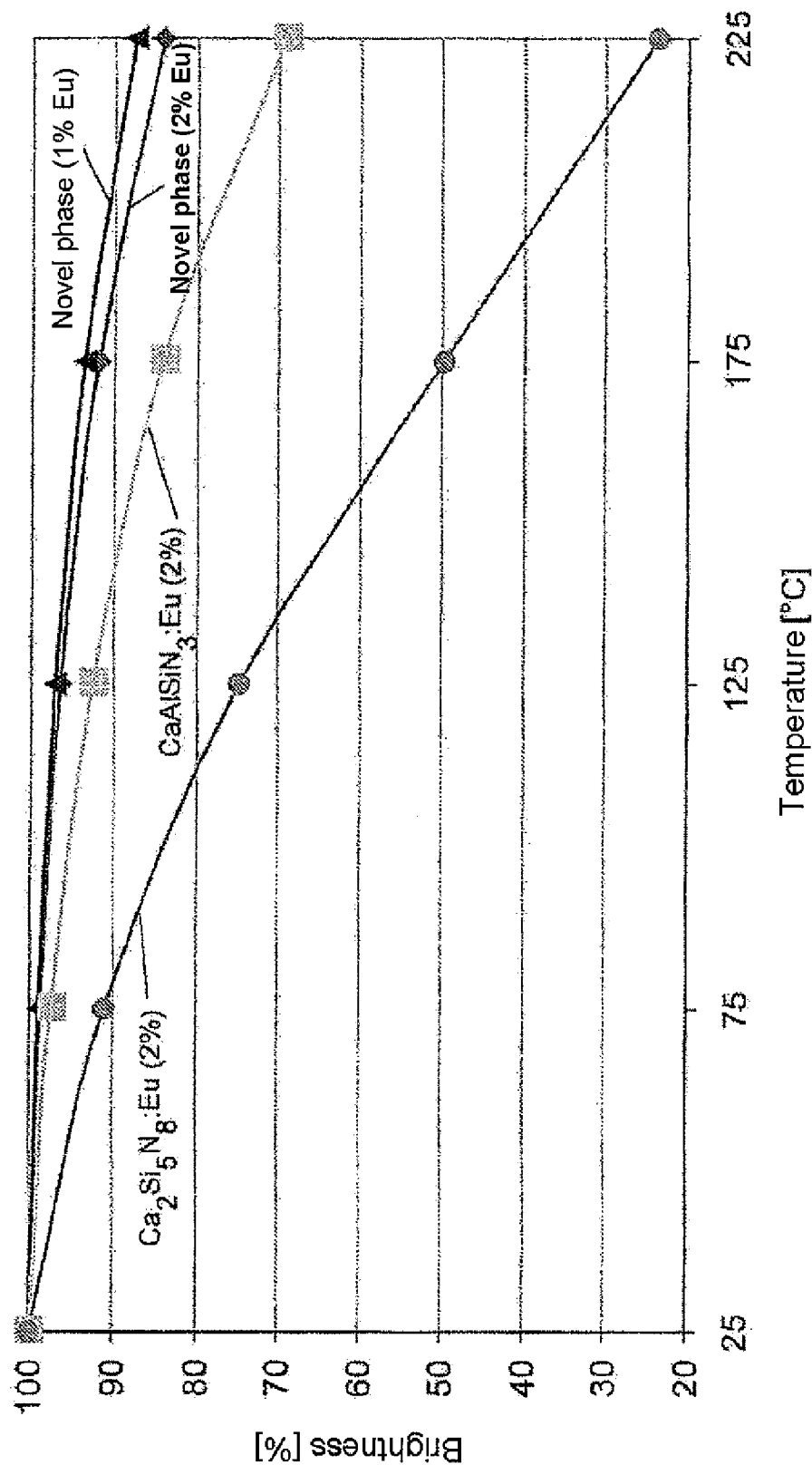
FIG. 8 shows the thermal stability of different phosphors.

The outstanding thermal stability of the novel silicon-richer phosphor is shown in FIG. 8, where the relative brightness of the two known red emitting phosphors Ca2Si5N8:Eu and CaAlSiN3:Eu is compared with the novel silicon-richer phase for a temperature range of 25 to 225° C. To date there is no known phosphor with less thermal quenching than the novel silicon-richer phase. Given the same Eu concentration of 2 mol %, the emission of Ca2Si5N8:Eu is thermally stable only to a limited extent. The relative brightness decreases to 30% with respect to that at room temperature. CaAlSiN3:Eu is appreciably stabler and uses only approximately 30% of brightness, such that the remaining brightness is still 70%. By contrast, the novel silicon-richer phase exhibits a high stability. The remaining brightness at 225° C. is approximately 85%. With a lower Eu content, it can be increased even further to just below 90%.

Figure 9:
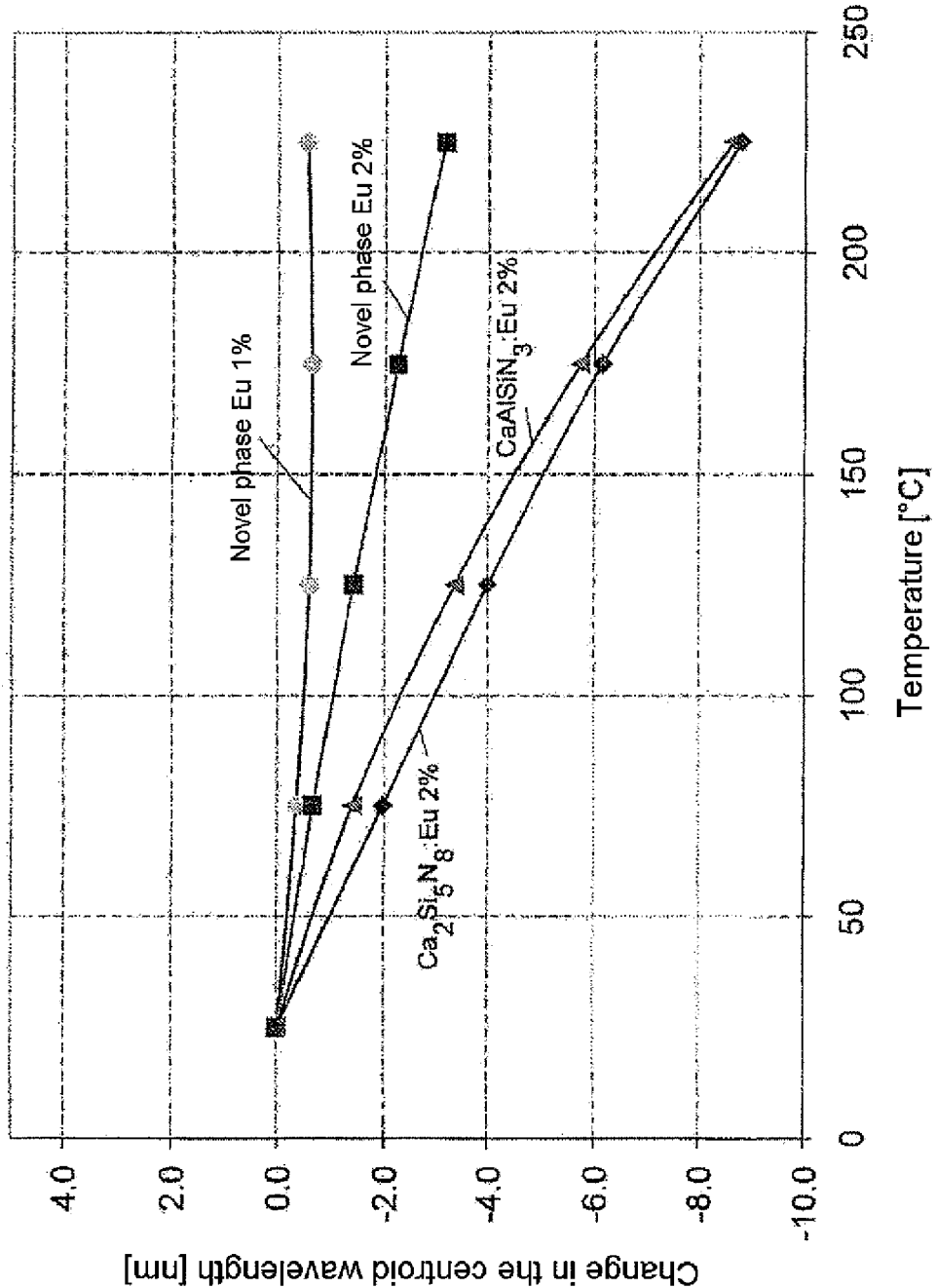
FIG. 9 shows the change in the centroid wavelength of different phosphors in the case of a temperature change.

A further outstanding property of the novel phosphor is the high stability of the centroid wavelength of the emission with a changing temperature, see FIG. 9. Practically no drift can be ascertained at a relatively low concentration of the activator, for example 1 mol % Eu. It is only at a higher concentration (2 mol %) that an appreciable drift toward shorter wavelengths can be observed. It is approximately 3 nm at 225° C. compared with room temperature. However, this drift is still significantly smaller than in the case of other red phosphors: in the case of Ca2Si5N8:Eu and in the case of CaAlSiN3:Eu, it is in each case of the order of magnitude of 9 nm in the same temperature range. These findings reveal the outstanding significance of the novel phosphor for high-power LEDs.

Figure 10:
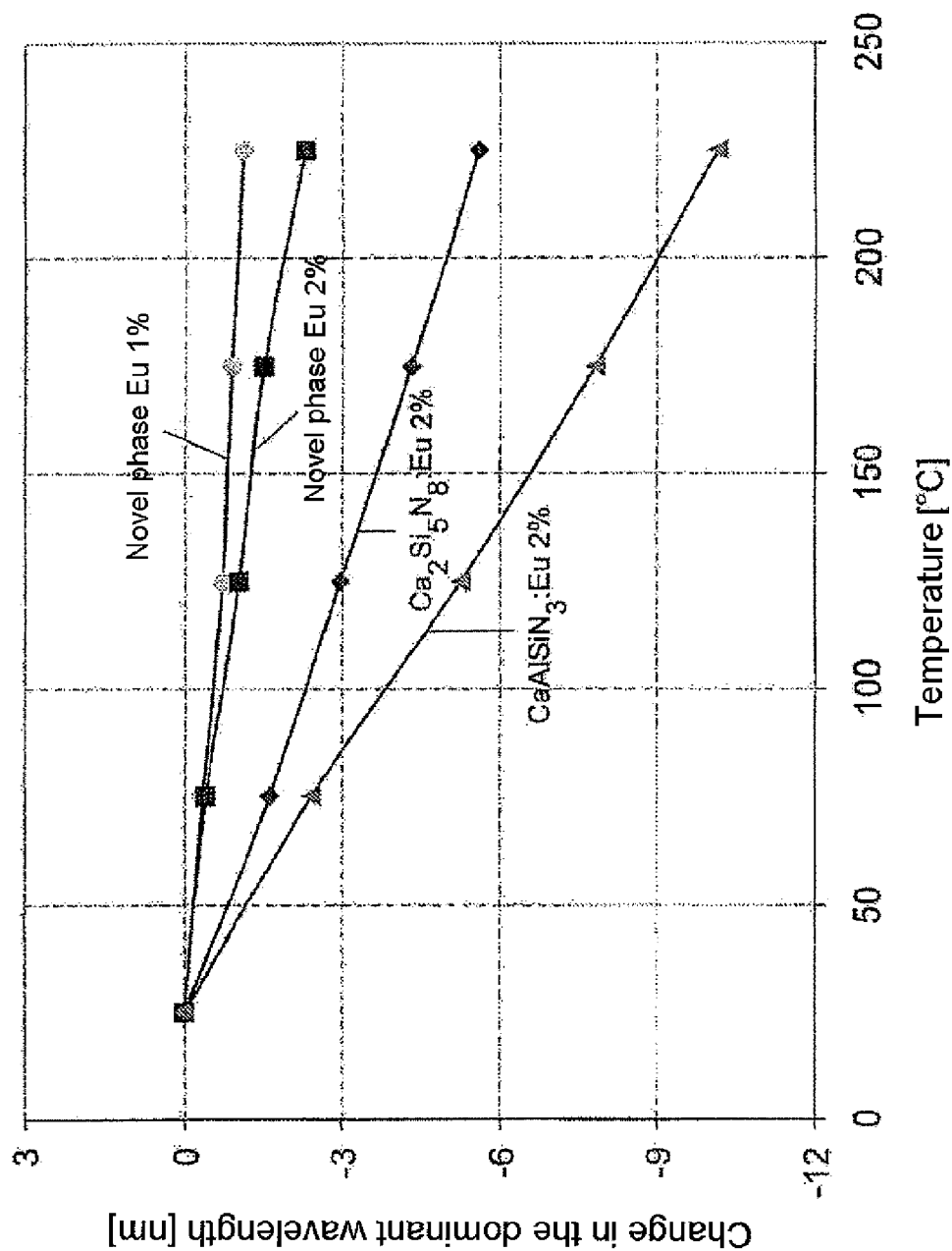
FIG. 10 shows the change in the dominant wavelength of different phosphors in the case of a temperature change.

A similar behavior is manifested upon examination of the dominant wavelength of the same phosphors, which is indicated in FIG. 10.

Figure 11:
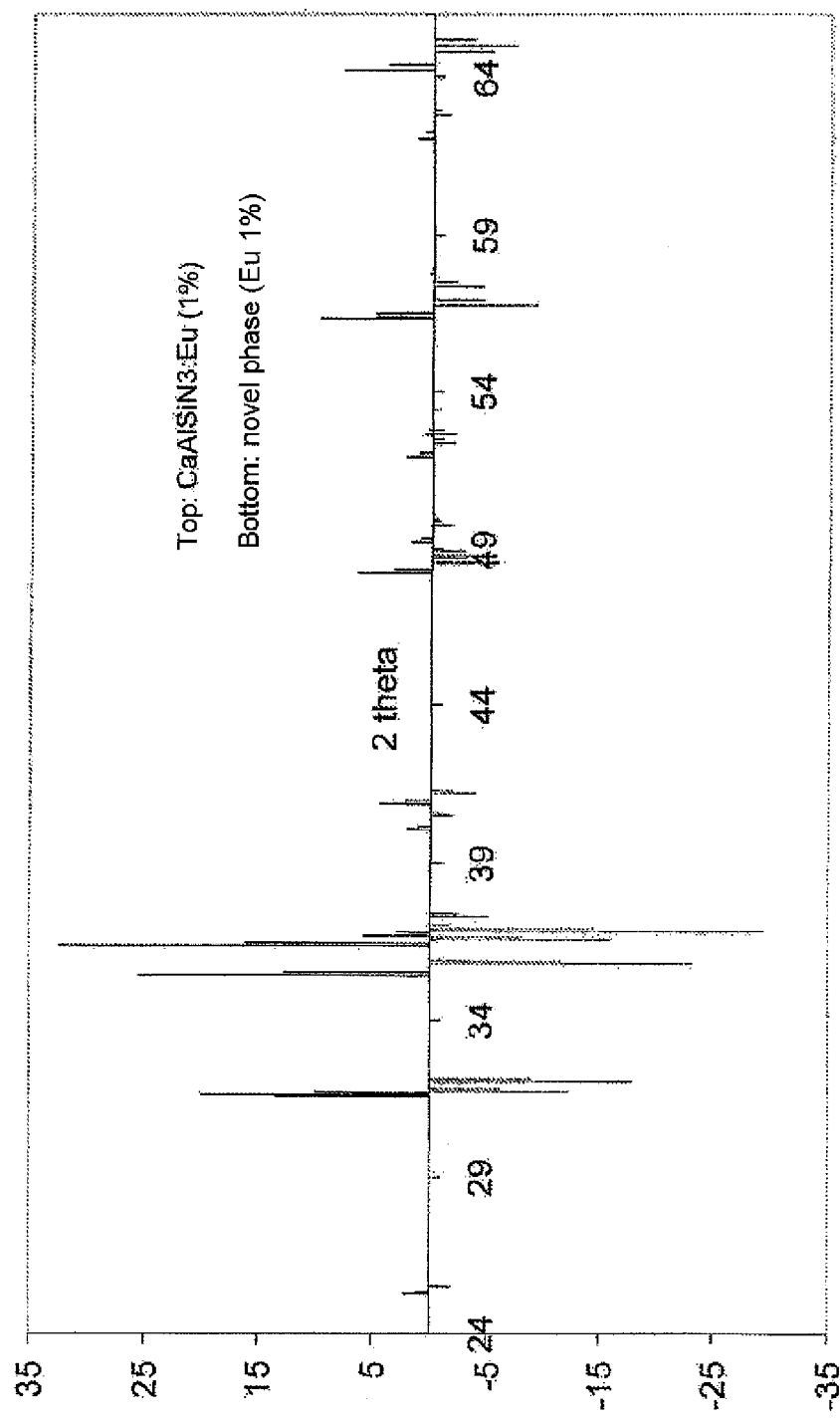
FIG. 11 shows a comparison of the most important XRD lines between different phosphors.

FIG. 11 shows a comparison of the position of the most important XRD lines (the basis is Cu—Kα radiation) for the CaAlSiN3:Eu (plotted toward the top) known from EP 1 568 753 and the novel silicon-richer phase Ca5Al4Si8N18:Eu (plotted toward the bottom).

Figure 12:
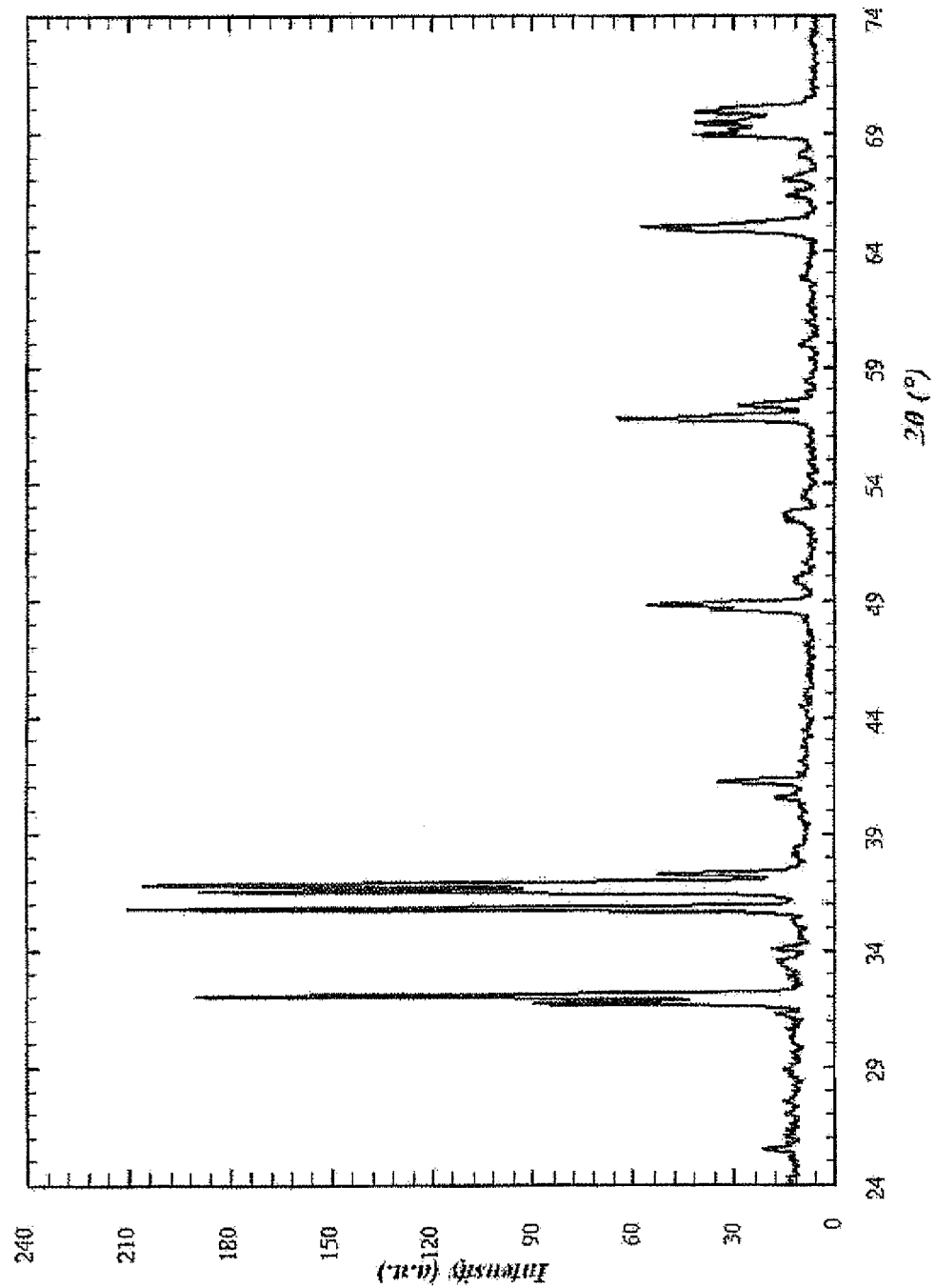
FIG. 12 shows a diffractogram of the novel phosphor.
Figure 13:
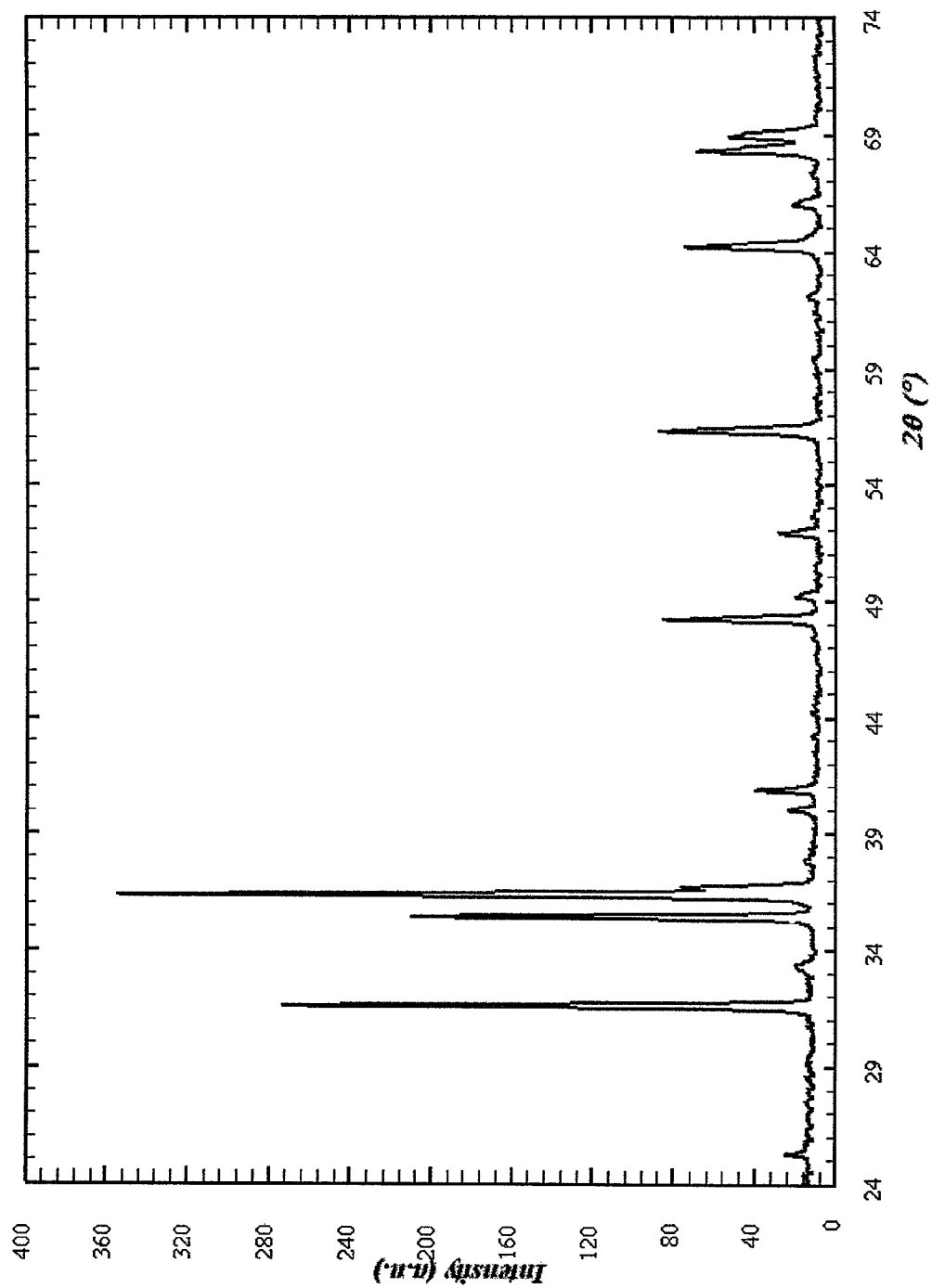
FIG. 13 shows a diffractogram of the known phosphor CaAlSiN3:Eu.
Figure 14:
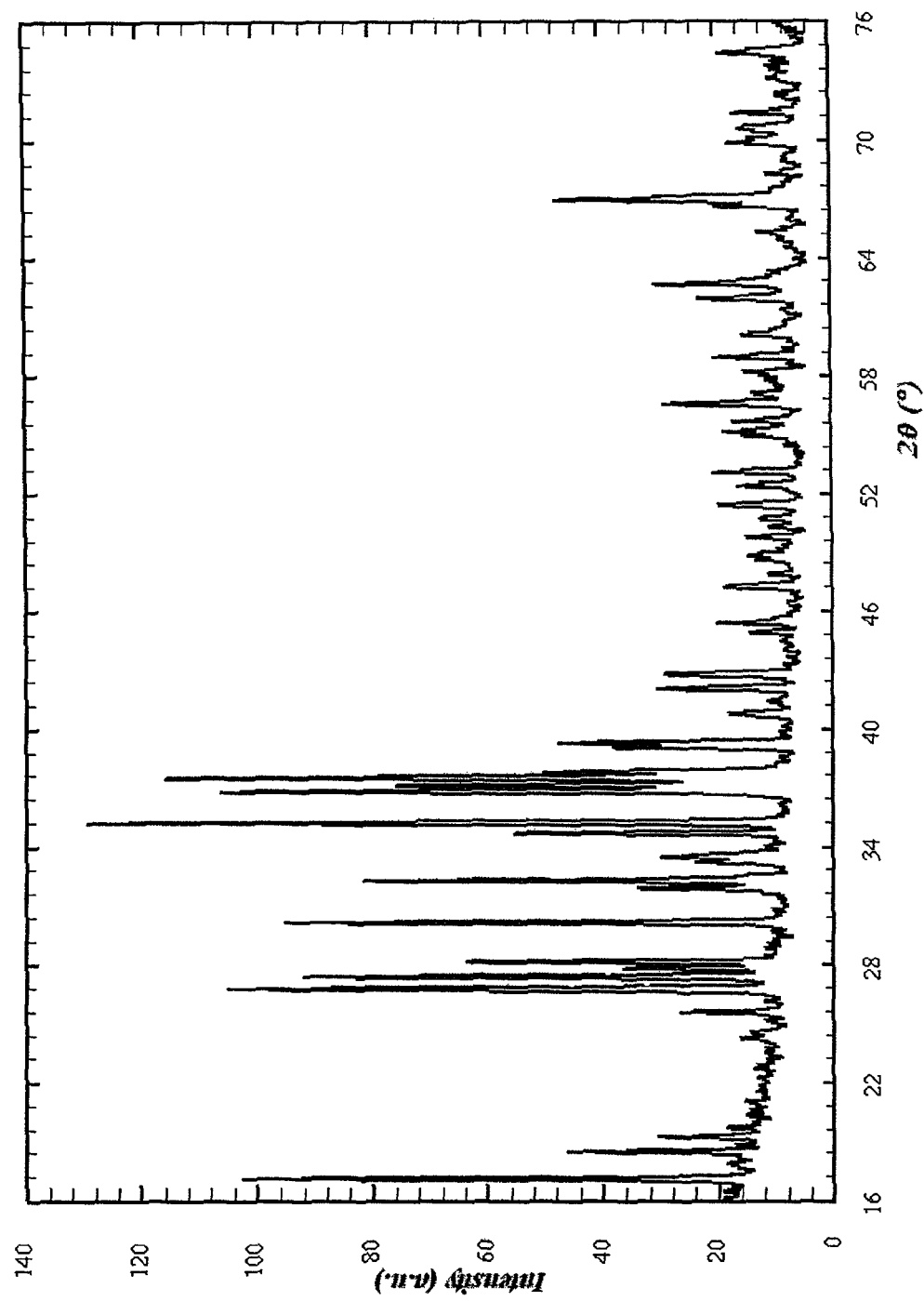
FIG. 14 shows a diffractogram of the known phosphor Ca2Si5N8:Eu.

FIG. 12 shows a diffractogram (XRD recording) for an exemplary embodiment of the novel phase. An XRD recording of the CaAlSiN3:Eu known from EP 1 568 753 is also shown (FIG. 13) in comparison with this.

The crystal lattices of the phosphors CaAlSiN3:Eu and Ca5Al4Si8N18:Eu can surprisingly be described in the same space group. A comparison of the lattice parameters for the known old CaAlSiN3:Eu (1%) and for the newly synthesized phosphor Ca5Al4Si8N18:Eu (1% Eu) reveals, for the longest axis of the conventional orthorhombic unit cell, a length a of 0.9802 nm (old) by comparison with 0.9531 nm (new). In general, for the compound mentioned above, good efficiencies are shown for phosphors whose lattice parameter of the longest axis a lies within the range of 0.950 to 0.965 nm. A variation of the lattice parameter can be achieved by e.g. a slight variation of the stoichiometry ($\delta \neq 0$).

Table 1 shows a measurement of the color locus components x, y on the basis of various compounds associated with the system Ca—Al—Si—N, normalized to Ca=1. The novel phosphor occurs at various points and exhibits one of the highest efficiencies.

The Eu-doped phosphor according to the invention can be produced for example as follows:

In principle, it is possible to produce various exemplary embodiments with and without a flux such as CaF2, AlF3, LiF or H3BO3.

For the synthesis, the precursor substances AlN, Ca3N2, Eu2O3, Si3N4 and preferably a flux such as CaF2 are used as starting substances.

The weighing-in of the starting substances is effected in the glovebox, wherein the batch quantity was 18 g or 20 g. The mixing is likewise effected in a protective gas atmosphere.

The batch mixture thus produced is filled into tungsten, aluminum nitride or boron nitride crucibles and annealed at temperatures of 1500° C.-1700° C. preferably in a 5% H2/95% N2 atmosphere. The holding time at the annealing temperature was between 2 and 5 h in the exemplary embodiments presented here.

After annealing, the annealed cake is ground in a mortar mill for 20 min and characterized further after a 54 μm screening.

TABLE 1

Examples of various weighed-in batch quantities:

| Substance | Sample 1 | Sample 2 | Sample 3 |
|---|---|---|---|
| Ca3N2 | 5.563 g | 5.482 g | 5.499 g |
| AlN | 3.729 g | 3.674 g | 3.686 g |
| Si3N4 | 8.508 g | 8.384 g | 8.409 g |
| Eu2O3 | 0.200 g | 0.197 g | 0.198 g |
| CaF2 | 0.000 g | 0.262 g | 0.000 g |
| H3BO3 | 0.000 g | 0.000 g | 0.208 g |
| Total weighed-in quantity | 18.000 g | 18.000 g | 18.000 g |

The novel phosphor is particularly well suited to application in light sources such as fluorescent lamps or, in particular, LEDs.

Figure 16:
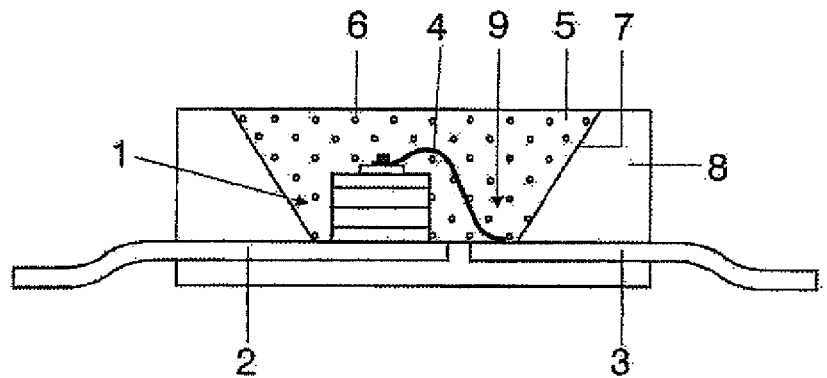
FIG. 16 shows the basic construction of a light source for red light.

The construction of a light source for red light is shown explicitly in FIG. 16. The light source is a semiconductor component with a chip 1 of the InGaN type having a peak emission wavelength in the UV of 405 nm, for example, which is embedded into a light-opaque basic housing 8 in the region of a cutout 9. The chip 1 is connected to a first connection 3 via a bonding wire 4 and is directly connected to a second electrical connection 2. The cutout 9 is filled with a potting compound 5, which contains as main constituents an epoxy casting resin (80 to 90% by weight) and phosphor pigments 6 (less than 20% by weight). The cutout has a wall 7 serving as a reflector for the primary and secondary radiation from the chip 1 and the pigments 6. The primary radiation of the UV LED is completely converted to red by the phosphor. The phosphor used is the nitridosilicate described above. A light source for white light can also thereby be realized analogously, by using three phosphors that are excited by the UV radiation source to emit red, green and blue. The red phosphor is the novel M5Al4Si8N18:Eu, the green phosphor is, for example, (Sr0.95Eu0.05)Si2O2N2 and the blue phosphor is, for example, an aluminate or phosphate phosphor such as BAM:Eu or SCAP:Eu or the like.

Figure 17:
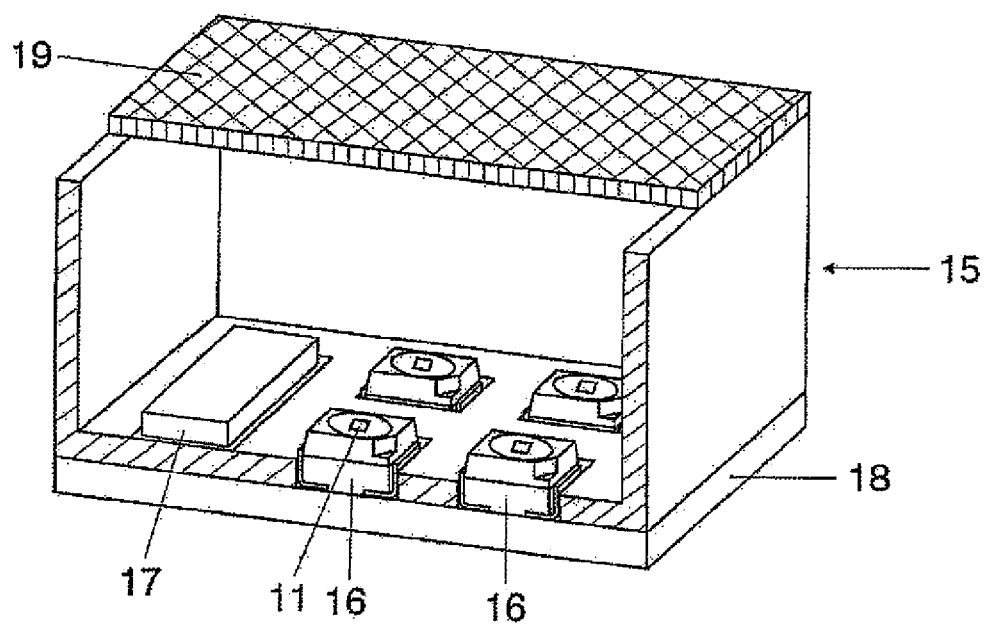
FIG. 17 shows the basic construction of a light source for white light.

The construction of a different light source for white light is shown explicitly in FIG. 17. The light source is a semiconductor component 16 of the LED type with a blue emitting chip 11 of the InGaN type having a peak emission wavelength of 460 nm, for example. The semiconductor component 16 is embedded into a light-opaque basic housing 18 with side wall 15 and cover 19. The chip is the primary light source for two phosphors. The first phosphor 14 is the oxynitridosilicate (Sr0.95Eu0.05)Si2O2N2, which partly converts the primary radiation from the chip 13 and converts it into green radiation having the peak emission 547 nm with $\lambda_{dom}$=563 nm. The second phosphor is the novel nitridosilicate M5Al4Si8N18:Eu, which partly converts the primary radiation from the chip 13 and converts it into red radiation having the peak emission 654 nm with $\lambda_{dom}$=600 nm.

The particular advantage of using a long-wave primary light source (450 to 465 nm) for the luminescence conversion LED is that problems with aging and degradation of housing and resin or phosphor are avoided here, with the result that a long service life is obtained.

In another exemplary embodiment, the primary light source used is a UV LED (approximately 380 nm) for a white RGB luminescence conversion LED, wherein problems with aging and degradation of housing and resin or phosphor have to be avoided to the greatest possible extent here by additional measures known per se, such as careful selection of the housing material, addition of UV-resistant resin components. The major advantage of this solution is the small viewing angle dependence of the emission color and the high color stability.

Figure 18:
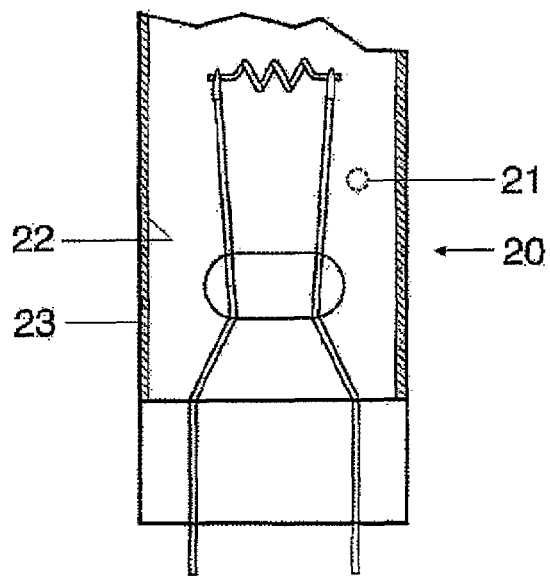
FIG. 18 shows the basic construction of a discharge lamp.

FIG. 18 shows a low-pressure discharge lamp 20 with a mercury-free gas filling 21 (schematically), which contains an indium compound and a buffer gas analogously to WO 02/10374, wherein a layer 22 composed of nitridosilicate M5Al4Si8N18:Eu is applied on the inside of the bulb 23. In particular, here M=Ca0.8Mg0.1Sr0.1 or Ca0.8Sr0.2. A blue and green phosphor is also quite generally admixed. BAM:Eu or BaMgAl10O17:Eu and SrSi2O2N2:Eu are well suited.

This phosphor system is firstly adapted to the indium radiation, since the latter has significant components both in the UV and in the blue spectral range which are both absorbed equally well. However, this mixture is also suitable for conventional fluorescent lamps. Application in a high-pressure-based indium lamp as known per se from U.S. Pat. No. 4,810,938 is also possible.

Figure 15:
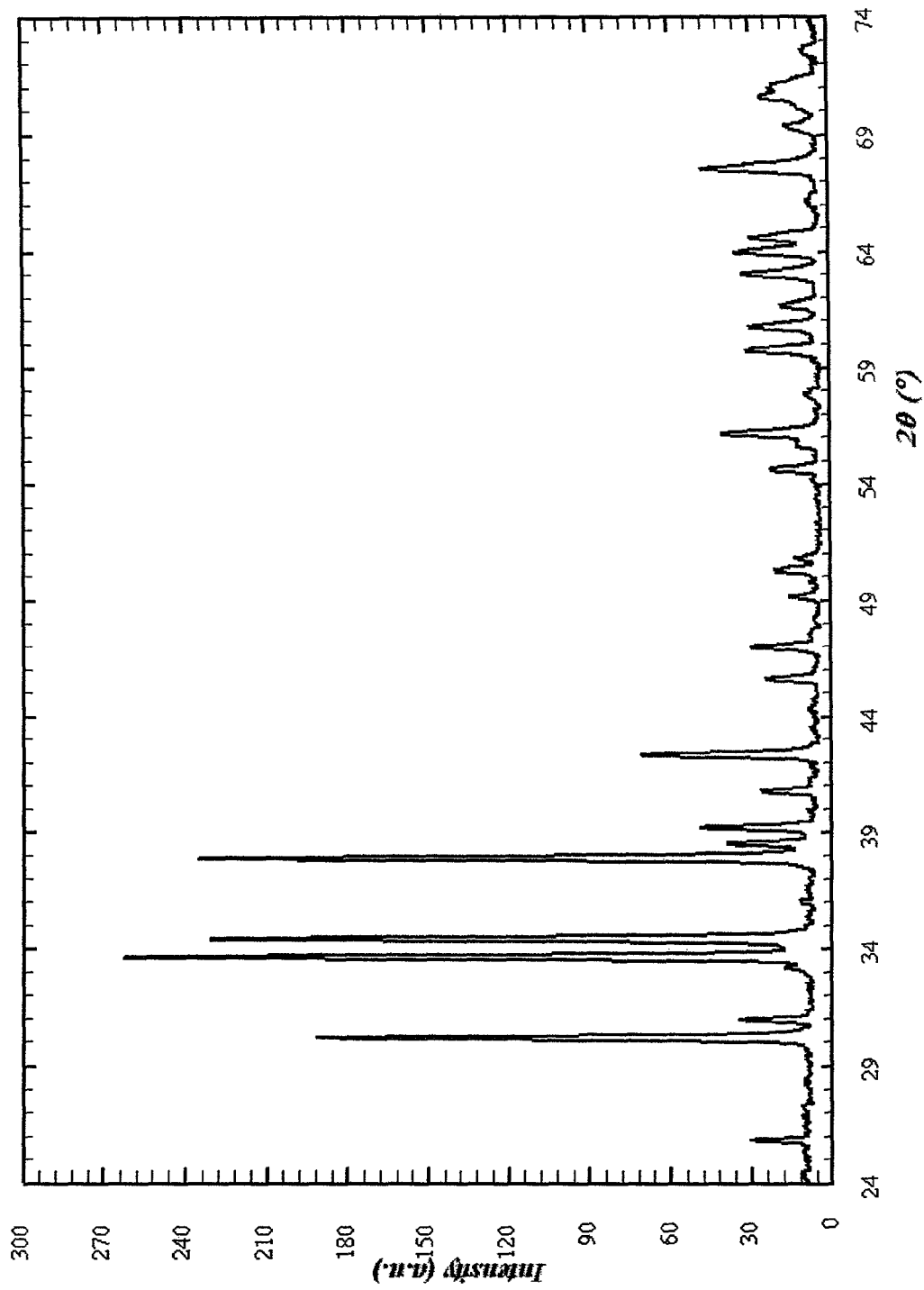
FIG. 15 shows a diffractogram of the known phosphor α-sialon.

A high-pressure discharge lamp with red improvement is shown in FIG. 15. In this case, the lamp has a customary discharge vessel with a metal halide filling. The radiation impinges on a phosphor layer on an outer bulb, which converts part of the primary radiation into red radiation components. The phosphor layer is composed of M5Al4Si8N18:Eu. This technique is described, in principle, for example in U.S. Pat. No. 6,958,575.

Figure 19:
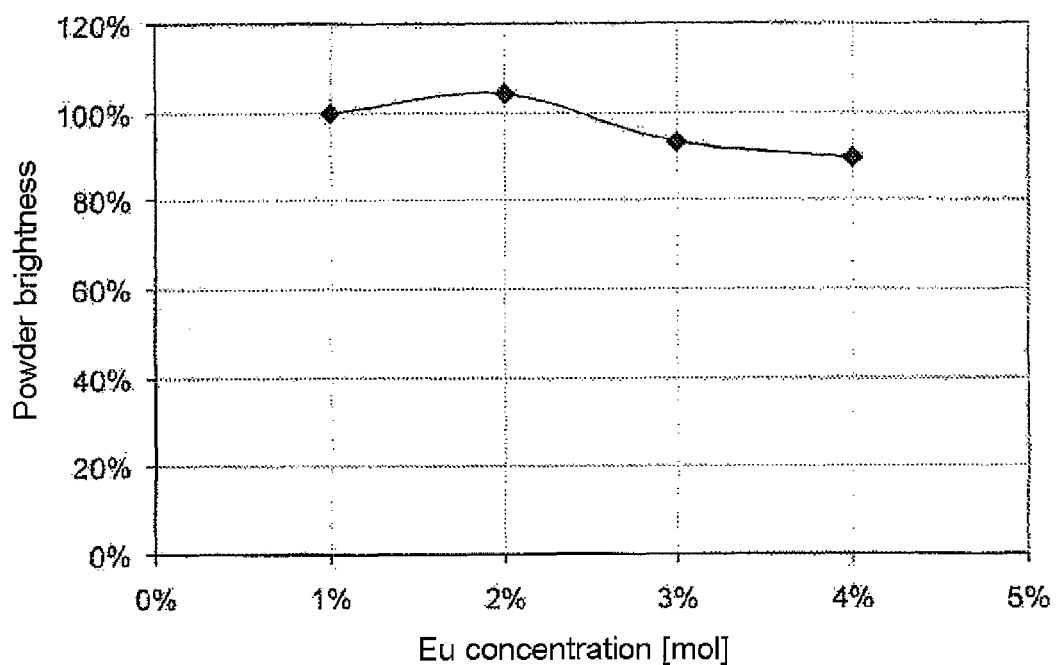
FIG. 19 shows the powder brightness of the novel phosphor as a function of the activator concentration.

FIG. 19 shows the powder brightness of the novel phosphor as a function of the content of activator Eu which replaces Ca. An optimum is found in the range around 1.5 mol % to 2.5 mol %. The powder brightness is a measure of the efficiency of the phosphor in an LED.

The novel phosphor can be produced both with and without a flux. In the latter case, a fluoridic flux such as CaF2 or AlF3 is preferred. While the known compound CaAlSiN3:Eu can apparently be produced without a flux in accordance with EP-A1 568753, in the case of Ca5Al4Si8N18:Eu the best results are obtained with fluoridic fluxes, in particular CaF2. If the efficiency of a sample without a flux is set at 100%, an efficiency of approximately 107% is achieved with addition of boric acid H3BO3, and an efficiency of even 117% is achieved when CaF2 is used as a flux. Chlorides such as CaCl2 or NH4Cl can also be used.

The novel phosphor can be described in particular by the formulation of a general stoichiometry corresponding to the following composition:

$Ca_{5-\delta}Al_{4-2\delta}Si_{8+2\delta}N_{18}$:EU where $|\delta| \leq 0.5$

In this case, the activator Eu in each case partly replaces the metal ion, preferably in the range of 0.5 to 5 mol %, particularly preferably in the range of 1 to 3 mol %. In this case, the parameter $\delta$ should lie in the range $|\delta| \leq 0.5$ and preferably $-0.5 \leq \delta \leq 0.35$, see FIG. 20. This is because the parameter of the product of quantum efficiency QE, visual brightness Vs and the value 1−R (R is the reflection) is then the highest. That is to say that the Si proportion of the novel silicon-rich phase is always at least 40% greater than the Al proportion (Si/Al>1.4) and the Ca/(Al+Si) ratio is always greater than 0.375. The stoichiometry thus differs distinctly from the alpha-sialon phase with a maximum Ca/(Si+Al) ratio of 1.5/12 (literature value)=0.125.

In this case, a replacement of SiN by AlO is also possible to a small extent, in particular in accordance with the formula

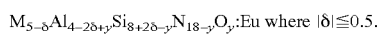

$M_{5-\delta}Al_{4-2\delta+y}Si_{8+2\delta-y}N_{18-y}O_y$:Eu where $|\delta| \leq 0.5$.

A value of $y \leq 2$ is preferred here. Typically, a small residual oxygen proportion of less than 2% by weight of oxygen is established as a result of oxygen impurities in the starting materials and through the choice of the starting materials and the synthesis method.

Not only Ca alone but, in particular, also a mixture of Ca and Sr and a mixture of Ca and Mg are suitable for M. In the case of the Ca—Sr mixture, that is to say M=(Ca,Sr), it is possible to use Sr proportions x of up to approximately 90 mol %, that is to say x=0 to 0.9 for $M=Ca_{1-x}Sr_x$. In the case of a Ca—Mg mixture, that is to say M=(Ca,Mg), it is possible to use Mg proportions x of up to approximately 50 mol %, that is to say x=0 to 0.5 for $M=Ca_{1-x}Mg_x$.

Figure 21:
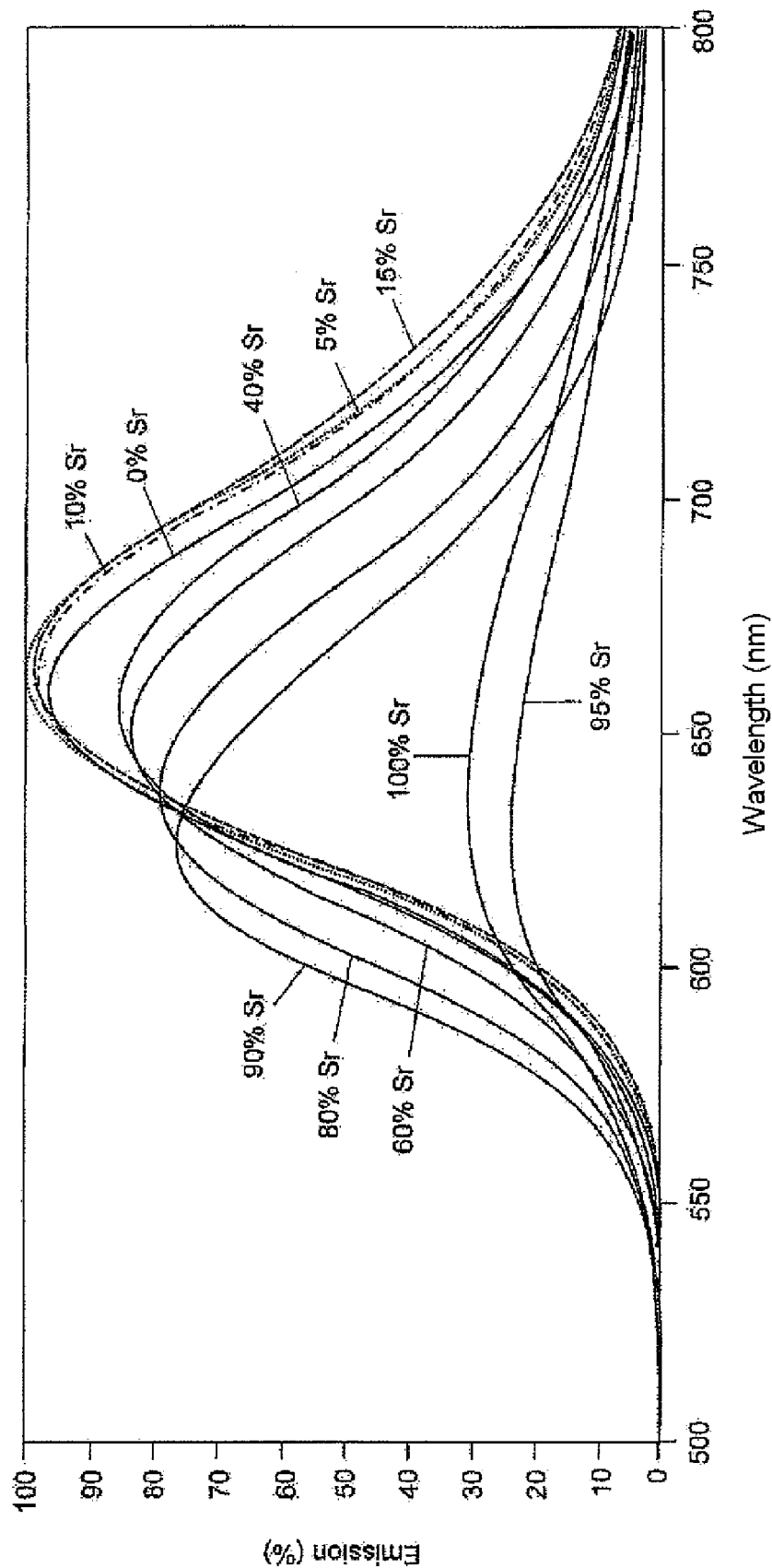
FIG. 21 shows the emission behavior of some further exemplary embodiments for the novel phosphor.
Figure 22:
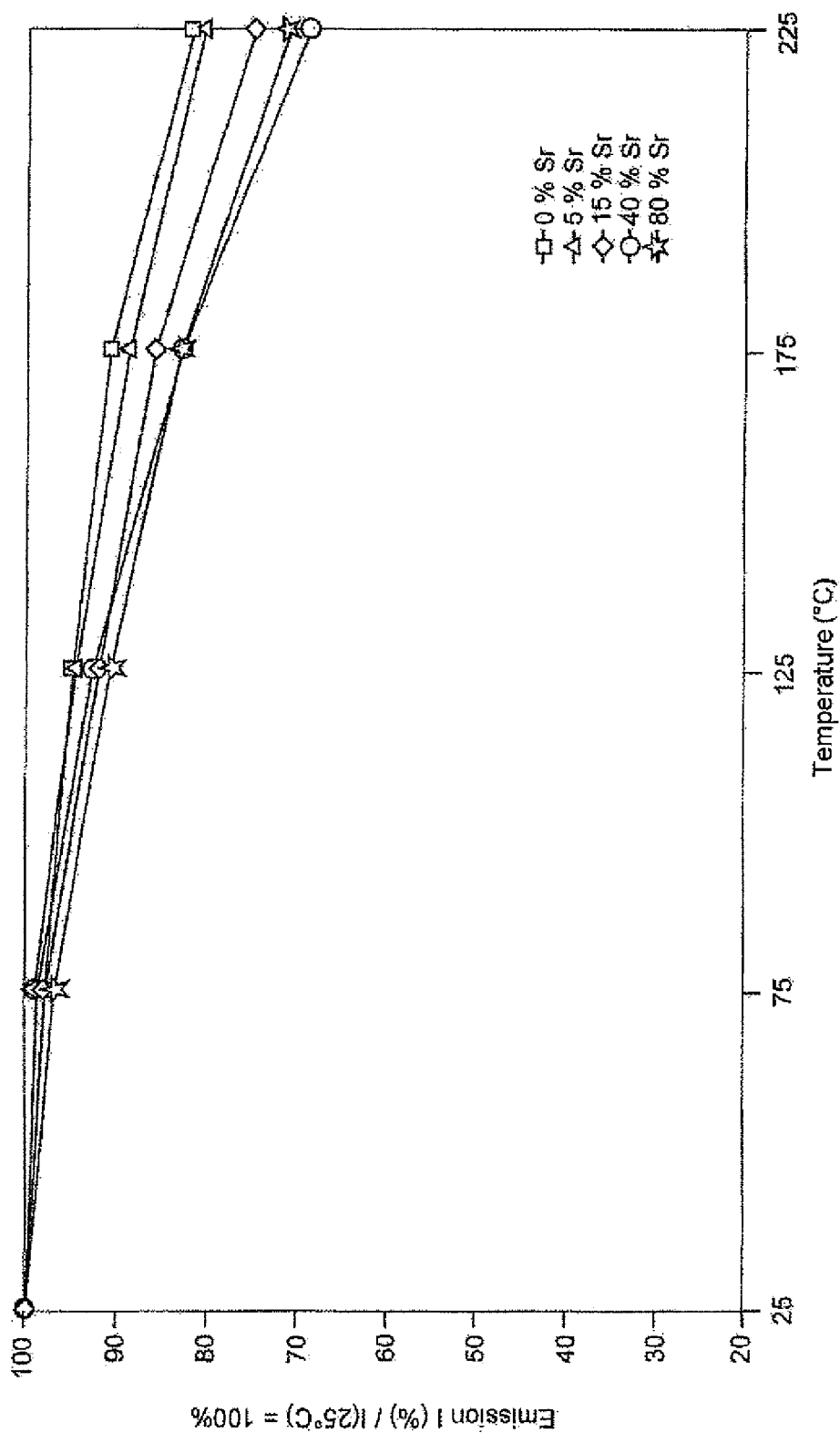
FIG. 22 shows the thermal quenching behavior of the phosphors from FIG. 21.

FIG. 21 shows the emission of $(Ca,Sr)_{5-\delta}Al_{4-2\delta}Si_{8+2\delta}N_{18}$:Eu(2%) where $\delta=-0.5$ for various Sr proportions x from x=0 to x=1. Since the Sr ion is larger than the Ca ion, it should bring about a shift in the peak wavelength toward shorter wavelengths since the interaction of the activator with its environment in the lattice should become smaller as a result of the expansion. It is surprisingly found, however, that the addition of Sr brings about different effects depending on how much Sr is added. With small additions of Sr, the intensity of the emission increases without a significant shift in the peak emission occurring. This effect holds true for additions of Sr of up to approximately x=0.2. With a further increase in the Sr admixture, the effect is not an increase in intensity, but rather a shift in the peak emission toward shorter wavelengths. This effect occurs approximately at x=0.25 to x=0.9. A further increase in the Sr proportion drastically reduces the intensity of the emission. FIG. 22 shows the temperature sensitivity of the novel phosphor, normalized to room temperature, in a range up to 225° C. It is found that all samples which are advantageous in terms of their emission behavior also exhibit a good thermal quenching behavior, and this holds true in particular for small admixtures of Sr up to 15%.

Figure 23:
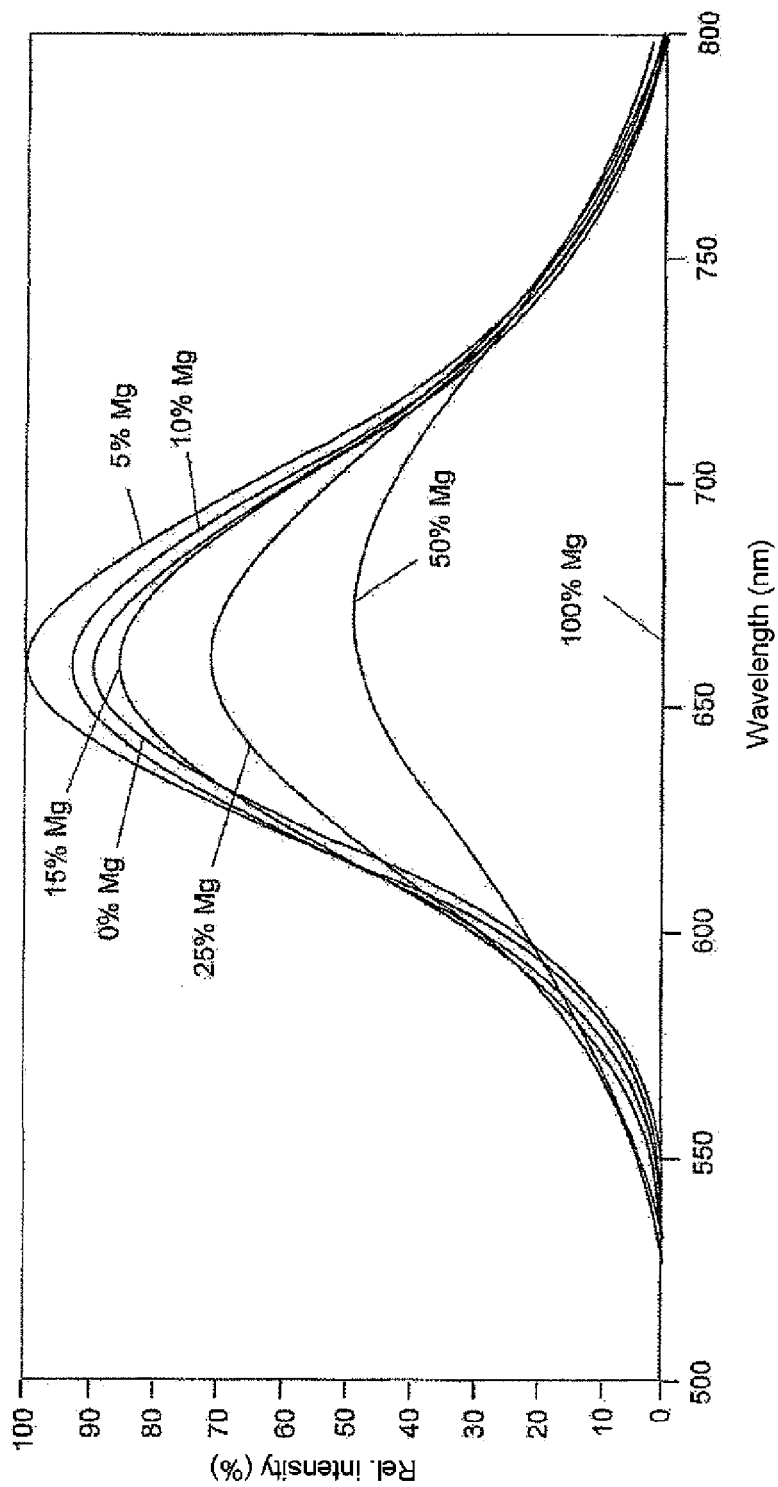
FIG. 23 shows the emission behavior of some further exemplary embodiments for the novel phosphor.
Figure 24:
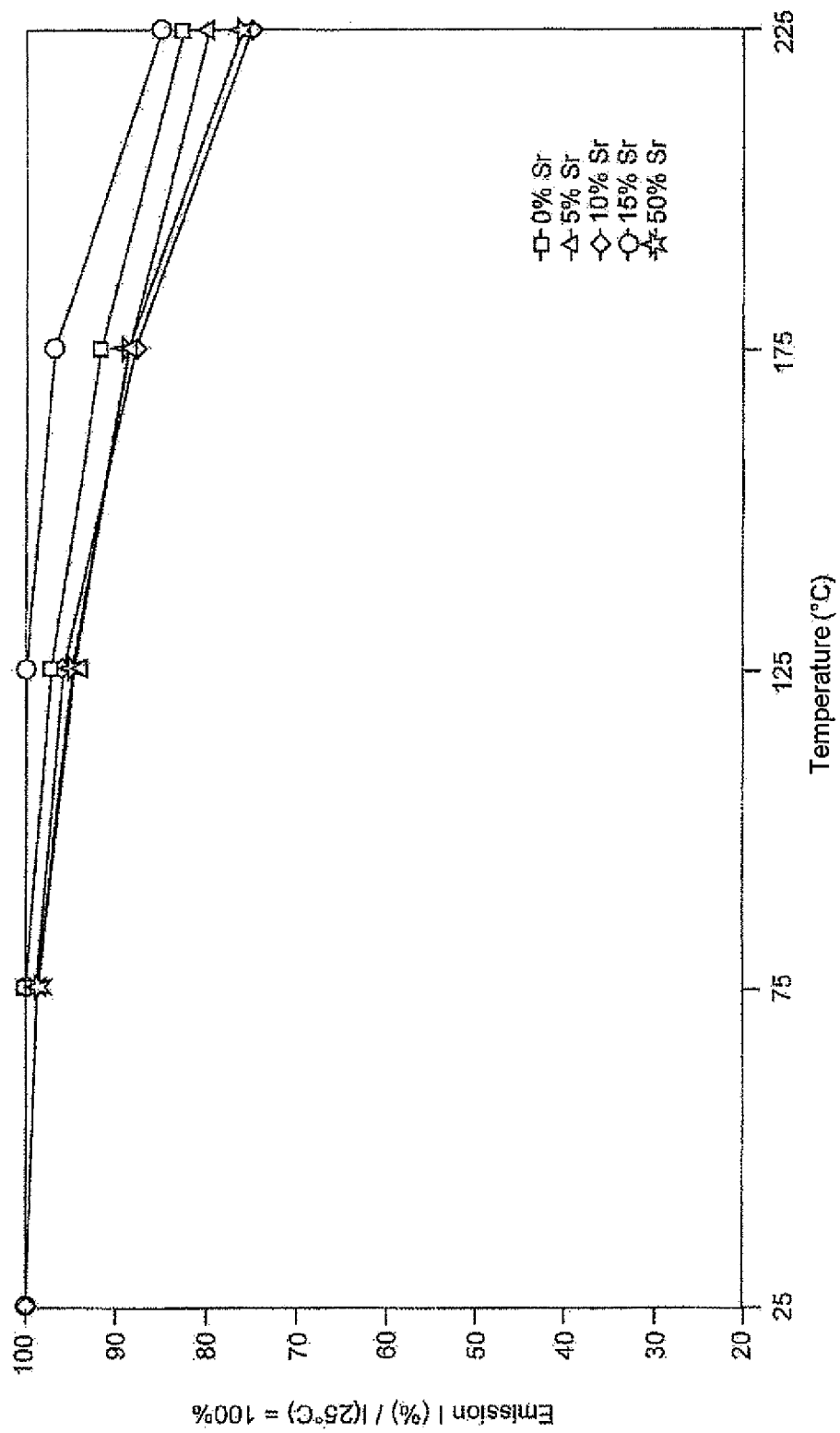
FIG. 24 shows the thermal quenching behavior of the phosphors from FIG. 23.

FIG. 23 shows the emission of $(Ca,Mg)_{5-\delta}Al_{4-2\delta}Si_{8+2\delta}N_{18}$:Eu(2%) where $\delta=-0.5$ for various Mg proportions x from x=0 to x=1. Since the Mg ion is smaller than the Ca ion, the addition of Mg should bring about a shift in the peak emission toward longer wavelengths. It is found, however, that the addition of Mg essentially only influences the intensity of the emission, to be precise depending on how much Mg is added. With small additions of Mg, the intensity of the emission increases, without a significant shift in the peak emission occurring. This effect holds true for additions of Mg of up to approximately x=0.1. With a further increase in the Mg admixture, the intensity decreases further and further, where relatively good values are still obtained up to x=0.25 and the intensity falls approximately to half in the case of x=0.5. Emission no longer occurs at all in the case of x=1. FIG. 24 shows the temperature sensitivity of the novel phosphor, normalized to room temperature, in a range up to 225° C. It is found that all samples which are advantageous in terms of their emission behavior also exhibit a good thermal quenching behavior; in particular, this surprisingly holds true for small Mg admixtures around 15%, in particular from 13 to 20%. Overall, therefore, an optimum Mg admixture lies approximately within the range of x=0.1 to 0.15.

Practically all the samples from FIGS. 22 and 24 are better suited to applications at high temperatures than the known CaAlSiN3:Eu(2%), which at 225° C. exhibits a thermal quenching behavior of 70% (powder brightness relative to room temperature 25° C.). Most of the samples shown have values of 75 to 85%.

Figure 25:
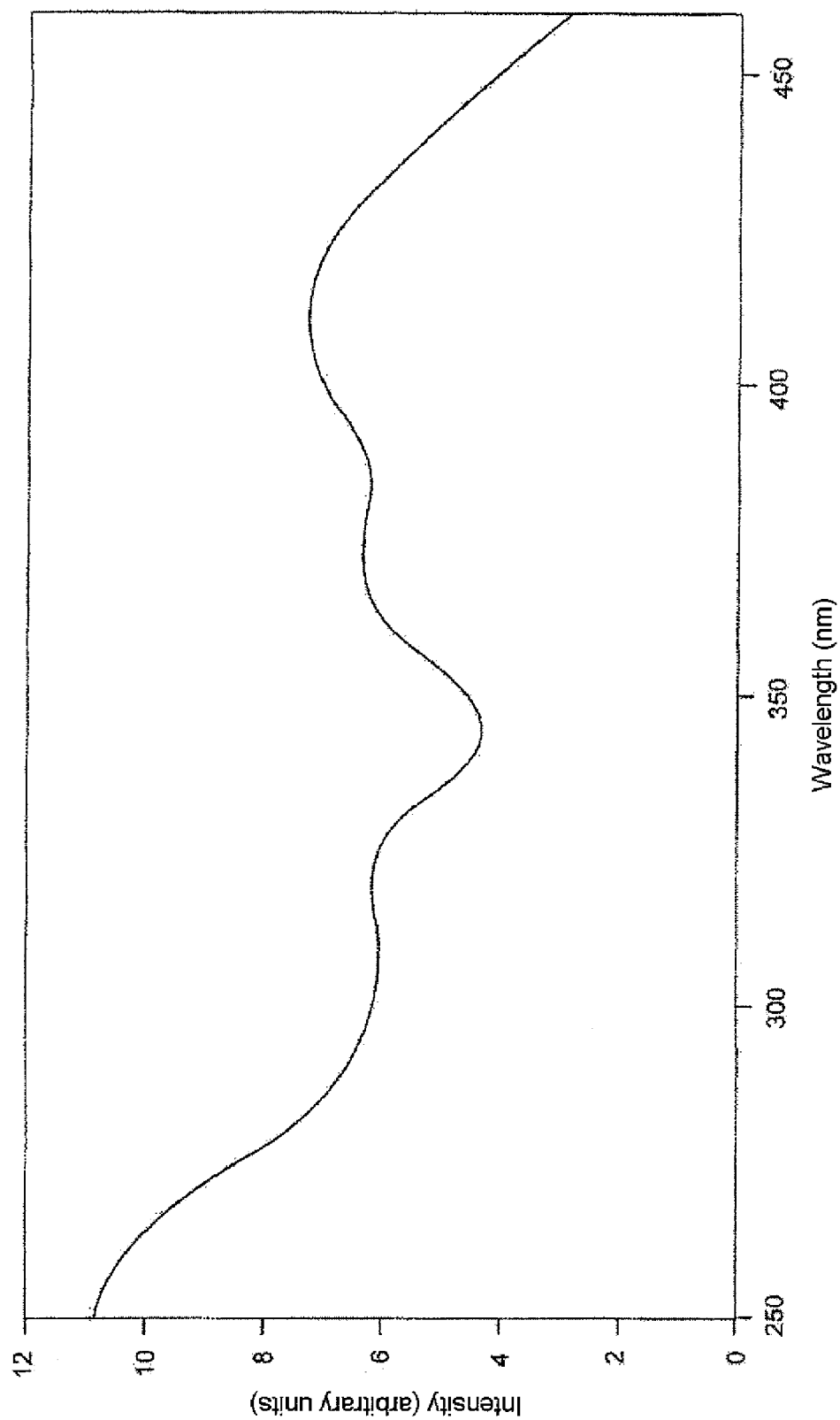
FIG. 25 shows the excitation behavior of a Ce-doped novel phosphor (detected emission wavelength 520 nm)

FIG. 25 shows the excitation spectrum of a sample—doped with cerium as activator—of the phosphor Ca5(Al0.98Mg0.02375)4Si8N18:Ce(1%), in which Ca is replaced by Ce to the extent of 1%. This Ce-doped phosphor can readily be excited approximately from 300 to almost 450 nm.

Further exemplary embodiments of the phosphor according to the invention concern other stoichiometries, and the additional incorporation of Li or else Na for M in small quantities of typically 0.5 to 6 mol % of M. Concrete examples are specified in Tab. 2. The excitation was effected at 460 nm, unless indicated otherwise.

TABLE 2

| Compound | Rel. q.e. | Rel. brightness | x | y | $\lambda_{dom}$ | Sample |
|---|---|---|---|---|---|---|
| $(Ca_{0.98}Eu_{0.02})_{5.5}Al_5Si_7N_{18}$ | 93% | 76% | 0.656 | 0.341 | 608 | A |
| $(Ca_{0.98}Eu_{0.02})_5Al_4Si_8N_{18}$ | 100% | 100% | 0.622 | 0.375 | 599 | B |
| $(Ca_{0.97}Eu_{0.01}Ce_{0.01}Li_{0.01})_5Al_4Si_8Ni_{18}$ | 77% | 99% | 0.592 | 0.403 | 594 | C |
| $(Ca_{0.97}Eu_{0.015}Ce_{0.015})_5Al_{3.975}Si_8N_{18}$ | 67% | 76% | 0.609 | 0.386 | 597 | D |
| $(Ca_{0.99}Ce_{0.01})_5(Al_{0.98}Mg_{0.02375})_4Si_8N_{18}$* | 44% | 57% | 0.344 | 0.479 | 558 | E |
| $(Ca_{0.94}Eu_{0.02}Li_{0.04})_5Al_{3.8}Si_{8.2}N_{18}$ | 97% | 93% | 0.626 | 0.371 | 600 | F |

*at 400 nm excitation

The relative quantum efficiency q.e., the relative brightness, the color locus components x and y and the dominant wavelength are specified.

The purely cerium-doped sample was excited approximately in the region of its absorption maximum at 400 nm. However, excitation at 460 nm is not ruled out because of this. It is evident that in the case of Eu, Ce-codoped samples, the color locus shifts with the excitation wavelength from 400 to 460 nm. For at 400 nm the Ce emission is excited better relative to Eu than at 460 nm. Overall, as a result of the green Ce emission component, the emission of the samples already becomes shorter in wavelength even at 460.

In the case of Ce incorporation, the charge compensation by means of the monovalent ion Li or else Na on the M site is advantageous, primarily with regard to the thermal quenching behavior. A variable Al/Si ratio can also be compensated for well by this means. In general, Li is introduced here by means of an oxygen-free precursor, usually LiF. Although the targeted Li incorporation with charge compensation by means of the Al/Si ratio reduces the efficiency minimally, in return it improves the thermal quenching behavior—particularly in the case of Eu-doped phosphors.

The thermal quenching behavior of the Ce-doped sample is excellent, seen in absolute terms. The purely Ce-doped embodiment emits in the green and the purely Eu-doped embodiment emits in the red, as already shown in Tab. 2. Moreover, it has also been found that small quantities of Cu can be used as a partial replacement for M, in particular up to 20 mol %, preferably up to 5 mol %. Emission and efficiency can thereby be influenced in a manner similar to that in the case of substitution with Mg or Sr.

Figure 26:
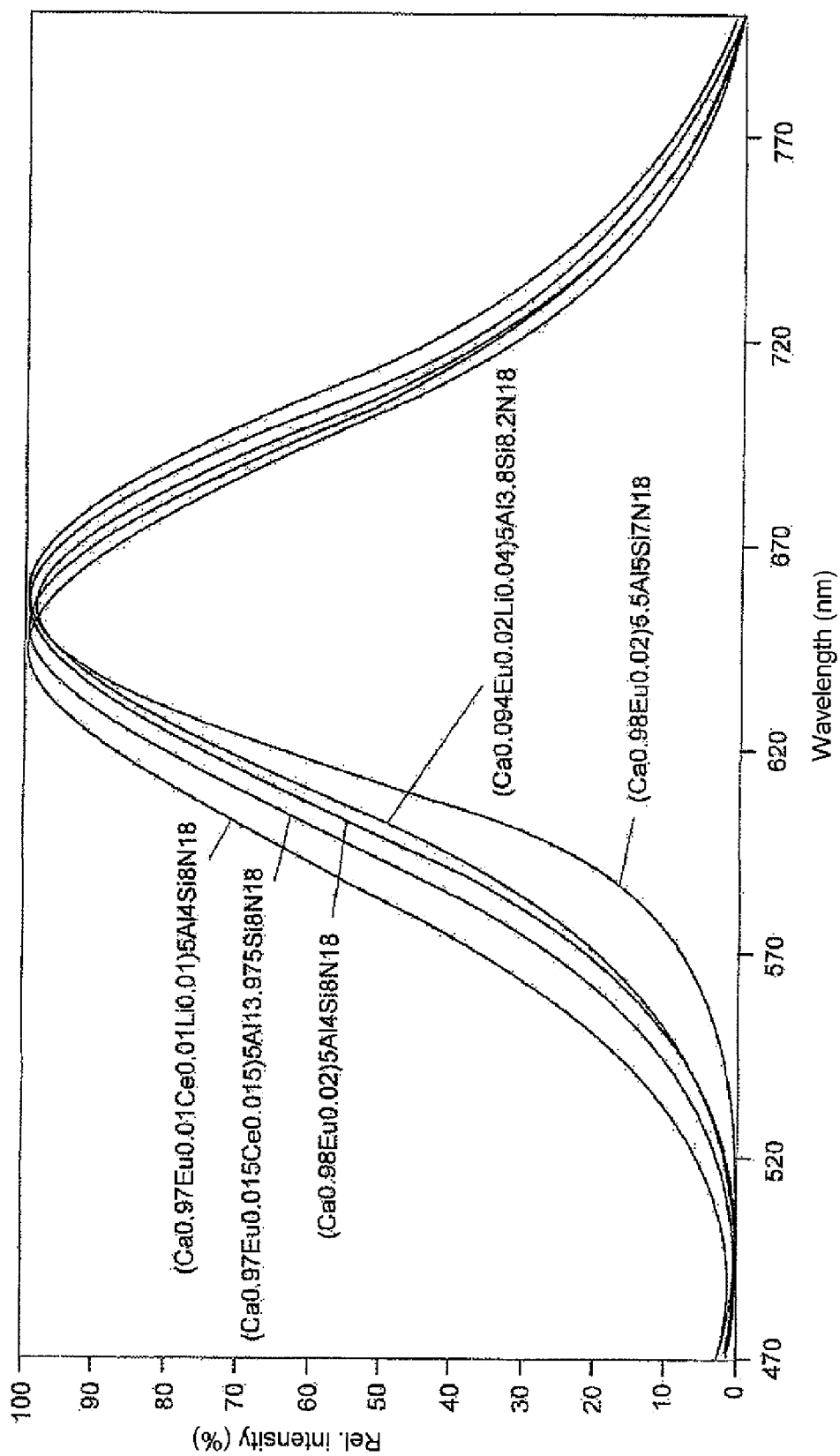
FIG. 26 shows the emission behavior of some further exemplary embodiments for the novel phosphor.

FIG. 26 shows the emission behavior of the samples A, B, C, D, F.

Figure 27:
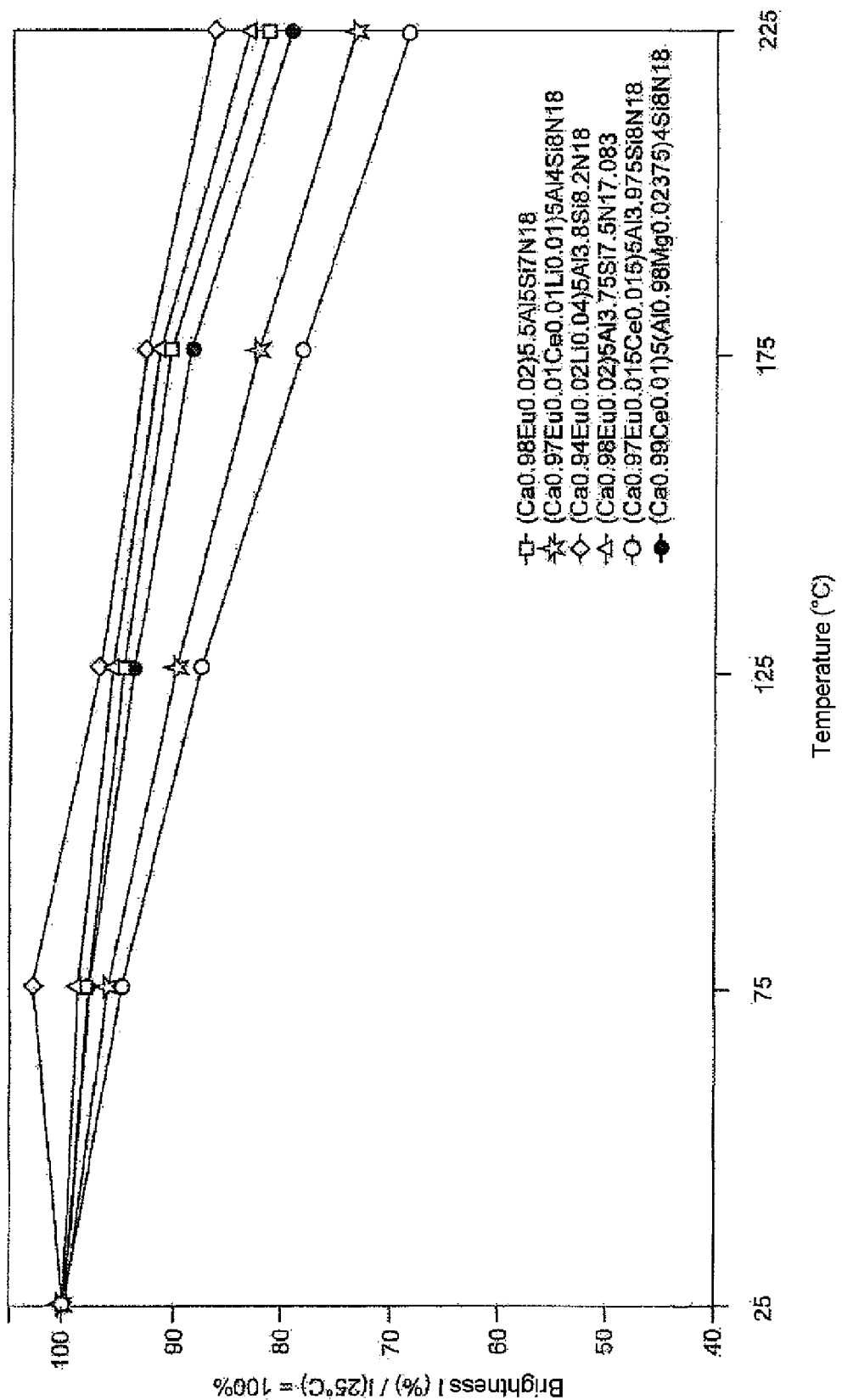
FIG. 27 shows the thermal quenching behavior of the phosphors from FIG. 26.

FIG. 27 shows the relative thermal quenching behavior of all six samples A to F up to 225° C. It is excellent for almost all the samples.

The invention claimed is:

1. A phosphor from the class of nitridosilicates from the M-Al—Si—N system, comprising a cation M, wherein M is represented by Ca alone or is represented by a mixture of Ca with at least one further element from the group Ba, Sr, Mg, Zn, Cd, Li, Na, Cu, wherein the phosphor is activated with at least one element from the group Eu, Ce which partly replaces M, wherein the phosphor forms a phase that is to be assigned to the system M3N2-AlN—Si3N4, wherein the atomic ratio of the constituents M:Al$\geq$0.375 and the atomic ratio Si/Al$\geq$1.4, wherein the phosphor has approximately the stoichiometry $M_{5-\delta}Al_{4-2\delta}Si_{8+2\delta}N_{18}$ where $|\delta|\leq 0.5$.

2. The phosphor as claimed in claim 1, wherein the activator is Eu, wherein the phosphor emits red.

3. The phosphor as claimed in claim 1, wherein the activator is Ce, wherein the phosphor emits green, or in that the activator is Eu, Ce, wherein the phosphor emits green to red.

4. The phosphor as claimed in claim 1, wherein the phosphor has approximately the stoichiometry M5Al4Si8N18.

5. The phosphor as claimed in claim 2, wherein the dominant wavelength of the phosphor lies within the range of 585 to 620 nm.

6. The phosphor as claimed in claim 1, wherein M=Ca or $M=Ca_{1-x}Sr_x$ where $x\leq 0.9$ or $M=Ca_{1-x}Mg_x$ where $x\leq 0.5$.

7. The phosphor as claimed in claim 2, wherein the proportion of the activator Eu in M is at least 0.5 mol % and preferably at most 5 mol %.

8. The phosphor as claimed in claim 1, wherein it can be excited photonically, to be precise within the range of 300 to 485 nm.

9. The phosphor as claimed in claim 2, wherein the longest axis a of the conventional orthorhombic unit cell lies within the range of 0.950 to 0.965 nm.

10. A light source comprising a primary radiation source that emits radiation in the short-wave range of the optical spectral range in the wavelength range of 300 to 485 nm, wherein said radiation is converted wholly or partly into secondary longer-wave radiation in the visible spectral range by means of at least one first phosphor as claimed in claim 1.

11. The light source as claimed in claim 10, wherein the primary radiation source used is a light emitting diode based on InGaN or InGaAlP or a low-pressure- or high-pressure-based discharge lamp, in particular with an indium-containing filling, or an electroluminescent lamp.

12. The light source as claimed in claim 11, wherein part of the primary radiation is furthermore converted into longer-wave radiation by means of a second phosphor.

13. The light source as claimed in claim 12, wherein-part of the primary radiation is furthermore converted into longer-wave radiation by means of a third phosphor, wherein the phosphors are chosen and mixed in particular suitably in order to generate white light.

14. The light source as claimed in claim 11, wherein the light source is a high-pressure discharge lamp with a metal halide filling which is contained in a discharge vessel accommodated in an outer bulb, wherein a light-converting coating containing a first phosphor is applied on the outer bulb.

15. A method for producing a highly efficient phosphor as claimed in claim 1, comprising the steps of:
 a) providing the starting substances M3N2, AlN and Si3N4 and the activator precursor, in particular Eu2O3, in a substantially stoichiometric ratio; mixing these starting substances; and
 b) annealing this mixture in a reducing atmosphere at a temperatures of between 1500 and 1700° C.

16. An illumination unit comprising at least one light source, wherein the light source emits primary radiation within the range of 300 to 485 nm, wherein this radiation is converted partly or completely into longer-wave radiation by means of phosphors that are exposed to the primary radiation of the light source, wherein the conversion is effected at least with the aid of a phosphor that originates from the class of nitridosilicates as claimed in claim 1.

17. The phosphor as claimed in claim 1, wherein it can be excited photonically, to be precise within the range of 300 to 470 nm.

18. The method of claim 15 further comprising a step of adding a fluoridic flux to the starting substances.

19. The method of claim 1 wherein 5 is no greater than 0.35 and no less than −0.5.

20. A phosphor from the class of nitridosilicates from the M-Al—Si—N system, comprising a cation M, wherein M is represented by Ca alone or is represented by a mixture of Ca with at least one further element from the group Ba, Sr, Mg, Zn, Cd, Li, Na, Cu, wherein the phosphor is activated with at least one element from the group Eu, Ce which partly replaces M, wherein the phosphor forms a phase that is to be assigned to the system M3N2-AlN—Si3N4, wherein the atomic ratio of the constituents M:Al≧0.375 and the atomic ratio Si/Al≧1.4, wherein the phosphor has approximately the stoichiometry $M_{5-\delta}Al_{4-2\delta+y}Si_{8+2\delta-y}N_{18-y}O_y$, where $|\delta|\leq 0.5$ and $0 \leq y \leq 2$.

21. A phosphor from the class of nitridosilicates from the M-Al—Si—N system, comprising a cation M, wherein M is represented by Ca alone or is represented by a mixture of Ca with at least one further element from the group Ba, Sr, Mg, Zn, Cd, Li, Na, Cu, wherein the phosphor is activated with Eu, which partly replaces M, wherein the phosphor forms a phase that is to be assigned to the system M3N2-AlN—Si3N4, wherein the atomic ratio of the constituents M:Al≧0.375 and the atomic ratio Si/Al≧1.4, wherein the phosphor emits red, and the longest axis a of the conventional orthorhombic unit cell lies within the range of 0.950 to 0.965 nm.

* * * * *